(12) United States Patent
Akahane et al.

(10) Patent No.: US 10,743,412 B2
(45) Date of Patent: Aug. 11, 2020

(54) SUBSTRATE AND SEMICONDUCTOR APPARATUS

(71) Applicant: SHIN-ETSU CHEMICAL CO., LTD., Tokyo (JP)

(72) Inventors: Saiko Akahane, Annaka (JP); Yoshihira Hamamoto, Takasaki (JP); Toshio Shiobara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 266 days.

(21) Appl. No.: 14/612,719

(22) Filed: Feb. 3, 2015

(65) Prior Publication Data

US 2015/0245476 A1 Aug. 27, 2015

(30) Foreign Application Priority Data

Feb. 27, 2014 (JP) .................................. 2014-37182
Feb. 27, 2014 (JP) .................................. 2014-37219
Mar. 11, 2014 (JP) .................................. 2014-47893

(51) Int. Cl.
*H05K 1/03* (2006.01)
*H05K 1/05* (2006.01)
(Continued)

(52) U.S. Cl.
CPC .......... *H05K 1/0366* (2013.01); *H05K 1/0373* (2013.01); *H05K 1/0393* (2013.01);
(Continued)

(58) Field of Classification Search
CPC ........ Y10T 442/2098; Y10T 442/2992; H05K 1/0366; H05K 1/0373; H05K 1/0393; H05K 3/022; H05K 3/385; H05K 3/386
(Continued)

(56) References Cited

U.S. PATENT DOCUMENTS 4,456,657 A * 6/1984 Cassat ..................... B32B 15/14
                                                  428/415
4,460,633 A * 7/1984 Kobayashi ............... D04H 3/04
                                                  428/105
(Continued)

FOREIGN PATENT DOCUMENTS

CN     102893417 A      1/2013
JP     S56-59847 A      5/1981
(Continued)

OTHER PUBLICATIONS

Machine translation of JP2006342445A, Oct. 2017.*
(Continued)

*Primary Examiner* — Shawn Mckinnon
(74) *Attorney, Agent, or Firm* — Oliff PLC

(57) ABSTRACT

The present invention provides the substrate comprises a fiber film base material comprising a sheet of a surface-treated fiber film or a plural number of sheets of the surface-treated fiber films being laminated, wherein the surface-treated fiber film has a value of a conventional flexural rigidity measured by a method according to JIS R 3420 of 3-fold to 100-fold to a value of a conventional flexural rigidity of an untreated fiber film.

There can be provided a substrate having a uniform and homogeneous insulating layer which does not generate unfastening or twisting of a fiber, and in addition to heat resistance, dimensional stability and impact resistance, having further excellent in bendability and flexibility.

29 Claims, 2 Drawing Sheets

(51) Int. Cl.
*H05K 3/02* (2006.01)
*H05K 3/38* (2006.01)

(52) U.S. Cl.
CPC ............ *H05K 3/022* (2013.01); *H05K 3/385* (2013.01); *H05K 3/386* (2013.01); *H05K 2201/0162* (2013.01); *H05K 2201/0195* (2013.01); *H05K 2201/0209* (2013.01); *H05K 2201/029* (2013.01); *H05K 2203/302* (2013.01); *Y10T 442/2098* (2015.04); *Y10T 442/2992* (2015.04)

(58) Field of Classification Search
USPC .................................................... 442/71, 180
See application file for complete search history.

(56) References Cited

U.S. PATENT DOCUMENTS

| | | | | |
|---|---|---|---|---|
| 5,431,765 | A * | 7/1995 | Decker | B32B 17/04 156/307.4 |
| 2007/0148442 | A1 * | 6/2007 | Shibayama | C08L 63/00 428/336 |
| 2010/0065880 | A1 | 3/2010 | Kashiwagi et al. | |
| 2010/0301725 | A1 | 12/2010 | Matsui et al. | |
| 2013/0011617 | A1 * | 1/2013 | Tasaki | B29C 45/14 428/148 |
| 2013/0032933 | A1 * | 2/2013 | Fuke | C08K 3/22 257/676 |
| 2013/0149520 | A1 * | 6/2013 | Zhu | C08G 77/30 428/220 |
| 2014/0194019 | A1 * | 7/2014 | Greer | C09J 183/04 442/150 |
| 2016/0044839 | A1 * | 2/2016 | Akahane | H05K 9/0086 442/1 |

FOREIGN PATENT DOCUMENTS

| | | |
|---|---|---|
| JP | H04-370275 A | 12/1992 |
| JP | H07-22719 A | 1/1995 |
| JP | H09-111187 A | 4/1997 |
| JP | H11-222768 A | 8/1999 |
| JP | 2003-183982 A | 7/2003 |
| JP | 2006-342445 A | 12/2006 |
| JP | 2006342445 A * | 12/2006 |
| JP | 2010-089493 A | 4/2010 |
| JP | 2011-005714 A | 1/2011 |
| JP | 2011-127074 A | 6/2011 |
| JP | 2011-152724 A | 8/2011 |
| JP | 2012-177877 A | 9/2012 |
| JP | 2013-095862 A | 5/2013 |
| JP | 5230532 B2 | 7/2013 |
| JP | 5262715 B2 | 8/2013 |
| JP | 5306226 B2 | 10/2013 |
| WO | 2008/139824 A1 | 11/2008 |
| WO | 2012/027337 A1 | 3/2012 |
| WO | WO2012165012 * | 12/2012 |

OTHER PUBLICATIONS

Machine translation of wo2012165012 (Year: 2012).*
Nov. 29, 2016 Office Action issued in Japanese Patent Application No. 2014-037182.
Nov. 29, 2016 Office Action issued in Japanese Patent Application No. 2014-037219.
Dec. 27, 2016 Office Action issued in Japanese Patent Application No. 2014-047893.
Aug. 23, 2017 Office Action issued in Chinese Application No. 201510088741.4.
Jul. 4, 2017 Office Action issued in Japanese Patent Application No. 2014-047893.
Apr. 9, 2018 Office Action issued in Chinese Application No. 201510088741.4.

* cited by examiner

SUBSTRATE AND SEMICONDUCTOR APPARATUS

BACKGROUND OF THE INVENTION

Field of the Invention

The present invention relates to a substrate using a surface-treated fiber film, and a semiconductor apparatus using the same.

Description of the Related Art

With remarkable progress of digital technology, miniaturization and higher performance of electronic devices represented by personal computers and mobile phones have been required. For example, for a printed wiring substrate which is a representative part of these electronic devices, there is a strong demand for improving characteristics of a glass fiber film which is a constitutional part of the printed wiring substrate in order to cope with the above-mentioned high density mounting and miniaturization. Also, speed up and high frequency of a computer, a mobile, communication infrastructures, etc., have advanced, and accompanied by this, it has been required to the printed wiring substrate to be a low dielectric material which decreases transmission loss. There is also a demand for a glass fiber film having low thermal expansion characteristics and high tensile rigidity characteristics. Further, it has earnestly been required to develop a thinner glass fiber film.

In addition, as represented by a semiconductor package for mobile phones in recent years, accompanied by high density mounting, miniaturization and higher performance of a semiconductor package, and a demand for a printed wiring substrate to be used is increasing. For example, to prevent warpage of a package after mounting from occurring, a substrate material having a lower linear expansion has been required, and to meet the requirement, a laminated substrate in which an organic resin composition into which an inorganic filler has been highly filled is impregnated into a glass fiber has been employed. However, since the resin composition has high viscosity, it generates unfastening or twisting of the glass fiber, and as a result, there are problems that uniformity of the substrate is impaired and the package is warped by inner shear stress.

With regard to the prior art relating to the present invention, there may be mentioned, for example, those described in the Patent Documents mentioned below. For the printed wiring substrate using glass fiber, in addition to high heat resistance, light resistance and impact resistance, heat conductivity, etc., have been also required accompanied by the use of high power modules in recent years. In fact, there are disclosed a white film and a metal laminate having a low linear expansion coefficient, which contain a thermoplastic resin or an epoxy resin, and a filler (Patent Documents 1 to 4). Also, there is disclosed a glass cloth having high whiteness by impregnating a metal salt into the glass cloth and drying, thereafter impregnating a silicone coupling agent into the same and drying, and a process for manufacturing a laminated substrate using the same (Patent Document 5). Further, there is disclosed a white substrate which comprises a UV absorber or a photostabilizer being contained in one surface of a white film comprising an acrylic copolymer and a filler (Patent Document 6). However, the epoxy resin or the thermoplastic resin has low heat discoloration resistance, etc., so that it cannot be used as a white substrate and a laminated substrate, and as a material for a high performance printed substrate having good heat resistance, only a ceramics substrate, etc., is present. However, the ceramic substrate involved the problems in processability, strength, discoloration resistance, etc.

As the conventional process for manufacturing the metal clad laminated substrate, there has widely been used a method in which an uncured state prepreg which is prepared by impregnating an epoxy resin, a phenol resin or a silicone resin, which are resins, into a glass fiber and drying the same, and a copper foil which is a metal layer are laminated, heated and pressed under pressure. In particular, a copper clad glass epoxy substrate in which an epoxy resin is impregnated into the glass fiber has generally been used. However, in recent years, a highly heat resistant substrate has been required in the points of employment of a lead-free solder having a high melting point, and heat generation of the device due to higher performance. The glass epoxy substrate has a glass transition temperature of around 200° C., and has a characteristic that it is easily discolored, so that there is a problem in heat resistance. Thus, a glass epoxy substrate in which an inorganic filler had been highly filled has been employed for the purpose of heat dissipation.

In the glass fiber to be used for the metal clad laminated substrate, a method of surface treating the fiber by a silane coupling agent has been employed to heighten affinity with the resin, and an attached amount thereof is generally 0.05 to 0.25% by mass (Patent Document 7). The conventional surface-treated glass fiber itself does not have self-standing property, and the fiber is not fixed. Therefore, when the resin into which an inorganic filler is highly filled is impregnated into the glass fiber, and after preparing an uncured state prepreg, the material is pressed under heating and pressure as mentioned above, unfastening and twisting are generated. Also, due to inner shear stress, twisting and warpage were generated to the substrate itself, and there was a problem that the characteristics become ununiform in the substrate.

Further, there is a problem that deformation or expansion occurs at high temperature, and dimensional stability of the substrate is lowered. To solve the problem of the dimensional stability, it has been proposed a method of using a glass cloth in which a count of twist of the glass fiber, and a ratio of the picks of the warp and the weft yarn are defined (Patent Document 8). When such a glass cloth is used, dimensional stability or solder heat resistance of the cloth itself at high temperature becomes good. However, it is necessary to have a specific fiber structure and weave structure, and fixation of the fiber has not yet been made, so that there remains a doubt in dimensional stability of the resin into which an inorganic filler is highly filled as mentioned above.

On the other hand, as a substrate for mounting which is required to have heat resistance, ceramics has also been used but it is expensive and is in a situation that it cannot correspond to a large-sized substrate in the aspect of processability.

Further, in recent years, there has been investigated a metal clad laminated substrate using a silicone resin, which is excellent in characteristics such as heat resistance, weather resistance, etc., which are in the problem of the epoxy resin (Patent Documents 9 to 11). However, the silicone resin has a lower glass transition temperature as compared with that of the epoxy resin that has been used in the conventional mounting substrate, so that the resin itself involves the problem of dimensional stability, and there is a problem of warpage due to thinning the substrate. In addition, when a copper foil clad laminated substrate is prepared, an adhesive force to the metal foil is insufficient and reliability is poor, and the problem of unfastening or twisting of the glass fiber which occurs at the time of pressing under heating and pressure has not yet been solved by the reason that it uses a surface-treated glass fiber similarly to the above-mentioned glass epoxy substrate, whereby it has been desired to develop a laminated substrate excellent in heat resistance and weather resistance, and further having good dimensional stability.

Thus, it has been reported a metal clad laminated substrate in which a glass silicone resin laminated substrate which had previously been laminated and molded at a high temperature is heat treated, an organometallic compound is impregnated thereinto and thermally decomposed, and then, a thermoplastic fiber film and a metal foil are superimposed and molded (Patent Document 12). In this method, whereas an adhesive force to the copper foil is improved, in fact, a polyimide film is used as the thermoplastic fiber film, so that an insulating layer surface of the substrate is colored to yellow which is derived from the polyimide resin from the initial stage. Therefore, it is difficult to expand the substrate into a substrate for mounting an LED or solar cell modules. In addition, a glass silicone laminated substrate is used so that there is a problem in flexibility, and there are still problems in unfastening or twisting of the glass fiber.

PRIOR ART REFERENCES

Patent Documents

[Patent Document 1] Japanese Patent No. 5306226
[Patent Document 2] Japanese Patent Laid-Open Publication No. 2011-005714
[Patent Document 3] Japanese Patent No. 5230532
[Patent Document 4] Japanese Patent No. 5262715
[Patent Document 5] Japanese Patent Laid-Open Publication No. H11-222768
[Patent Document 6] Japanese Patent Laid-Open Publication No. 2012-177877
[Patent Document 7] Japanese Patent Laid-Open Publication No. H04-370275
[Patent Document 8] Japanese Patent Laid-Open Publication No. H07-022719
[Patent Document 9] Japanese Patent Laid-Open Publication No. 2010-089493
[Patent Document 10] Japanese Patent Laid-Open Publication No. H09-111187
[Patent Document 11] Japanese Patent Laid-Open Publication No. 2013-095862
[Patent Document 12] Japanese Patent Laid-Open Publication No. 2011-152724

SUMMARY OF THE INVENTION

The present invention has been accomplished in view of the above-mentioned circumstances, and an object thereof is to provide a substrate having a uniform and homogeneous insulating layer which does neither generate unfastening nor twisting of the fiber when a substrate is prepared, and in addition to heat resistance, dimensional stability and impact resistance, having also excellent in bendability and flexibility.

To solve the above-mentioned problems, the present invention is to provide a substrate which comprises a fiber film base material comprising a sheet of a surface-treated fiber film or a plural number of sheets of the surface-treated fiber films being laminated, wherein the surface-treated fiber film has a value of a conventional flexural rigidity measured by a method according to JIS R 3420 of 3-fold to 100-fold to a value of a conventional flexural rigidity of an untreated fiber film.

When such a substrate is employed, according to the surface treatment, it can be obtained a substrate without unfastening or twisting of the fiber, having high strength, the fiber of which is fixed, and in addition to heat resistance, dimensional stability and impact resistance, having also excellent in bendability and flexibility and an insulating layer of which has high uniformity and homogeneity.

Among these, the above-mentioned substrate is preferably a substrate containing a white pigment.

When such a substrate is employed, the substrate can be made those having high reflectance.

Also, the above-mentioned substrate is preferably a substrate having a metal layer(s) onto one surface or both surfaces of the surface-treated fiber film or a laminate thereof.

To the substrate of the present invention, a metal layer(s) can be provided as mentioned above.

Further, it is preferable that the above-mentioned substrate comprise a sheet of a prepreg using a surface-treated glass fiber film or a plural number of sheets of prepregs using a surface-treated glass fiber film(s) being laminated, wherein the above-mentioned prepreg is in an uncured state in which a thermosetting resin composition is coated onto the above-mentioned surface-treated glass fiber film and dried.

When such a substrate is employed, the prepreg is used in an uncured state so that the prepreg itself has a self-adhesive ability, whereby it is not necessary to provide an adhesive layer between the metal layer and the insulating layer, or between the laminated layers of the insulating layer, and the substrate can be manufactured simply and easily.

Moreover, it is preferable that the surface-treated fiber film contain glass fiber, and a part or whole of the glass fibers be bundled and surface-treated by a cured product of an organosilicon compound.

When such a surface-treated fiber film is employed, the fibers are fixed by higher strength, and it is a film subjected to a surface-treatment by an organosilicon compound, so that a substrate having excellent heat resistance, electric insulation and discoloration resistance can be obtained.

Furthermore, the above-mentioned metal layer(s) is/are preferably formed by metal plating, a metal foil or a metal plate.

In the substrate of the present invention, the metal layer(s) can be formed as mentioned above.

Also, it is preferred to have an adhesive layer(s) comprising an adhesive resin composition between the surface-treated fiber film and the above-mentioned metal layer(s) or between the surface-treated fiber films with each other, or both of these.

When such a substrate is employed, adhesive forces between the surface-treated fiber film and the metal layer(s), and between the surface-treated fiber films are improved, so that a substrate excellent in dimensional stability can be obtained.

Further, the above-mentioned adhesive resin composition is preferably thermosetting.

When such a substrate is employed, a substrate more excellent in heat resistance, discoloration resistance and higher mechanical strength can be obtained.

Moreover, it is preferable that the above-mentioned substrate comprise a material prepared by further superimposing a prepreg base material comprising at least one sheet of a prepreg(s) in an uncured state in which a thermosetting resin composition has been impregnated into the base material and dried being laminated with the above-mentioned fiber film base material, and at least one of the above-mentioned surface-treated fiber film and the above-mentioned prepreg contains a white pigment.

In this case, the above-mentioned substrate preferably comprises the above-mentioned fiber film base material and the above-mentioned prepreg base material which are alternately superimposed.

Furthermore, the above-mentioned substrate preferably comprises each two or more sheets of the above-mentioned fiber film base materials and the above-mentioned prepreg base materials being laminated.

When such a substrate is employed, a substrate more excellent in dimensional stability and impact resistance can be obtained.

Further, the above-mentioned thermosetting resin composition is preferably a silicone resin composition.

When such a thermosetting resin composition is used, a substrate more excellent in heat resistance, discoloration resistance and electric insulation can be obtained.

It is also preferable that the silicone resin composition comprise the following Components (A) to (C):
(A) an organopolysiloxane represented by the following average composition formula,

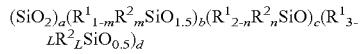

wherein $R^1$ represents a monovalent saturated hydrocarbon group having 1 to 10 carbon atoms or a monovalent aromatic hydrocarbon group having 6 to 12 carbon atoms; $R^2$ represents a monovalent unsaturated hydrocarbon group having 2 to 8 carbon atoms; m=0 to 1, n=0 to 2, L=0 to 3, and 1≤m+n+L≤6, and "a", "b", "c" and "d" are numbers each satisfying 0≤a≤1, 0≤b≤1, 0≤c≤0.9, 0≤d≤0.9, a+b>0, and a+b+c+d=1,
(B) a hydrogen polysiloxane containing one or more hydrosilyl groups, and
(C) a platinum based catalyst in an amount effective for curing.

When such a thermosetting resin composition is used, a substrate having more excellent heat resistance, discoloration resistance and higher mechanical strength can be obtained.

Moreover, the above-mentioned thermosetting resin composition preferably contains a filler.

When such a thermosetting resin composition is used, a substrate having more excellent dimensional stability and mechanical strength, and having further excellent heat conductivity can be obtained.

Also, the surface-treated fiber film preferably contains a filler.

When such a substrate is employed, a substrate having more excellent dimensional stability and mechanical strength, and having further excellent heat conductivity can be obtained.

Further, the above-mentioned filler preferably contains a white pigment.

When such a substrate is employed, a substrate having good light reflectance can be obtained.

Moreover, the above-mentioned substrate is preferably a substrate which is bendable at 90° or more.

When such a substrate is employed, it can be suitably used as a flexible substrate which is required to have high bendability and flexibility.

Furthermore, the present invention provides a semiconductor apparatus prepared by using the above-mentioned substrate.

When such a semiconductor apparatus is employed, a substrate having a uniform and homogeneous insulating layer, and having high strength and excellent heat resistance, dimensional stability, impact resistance, electric insulation, bendability, flexibility and discoloration resistance is used, so that the resulting semiconductor apparatus becomes a high quality semiconductor apparatus which can be suitably used in the field which requires high heat resistance.

When the substrate according to the present invention is employed, a substrate has neither unfastening nor twisting of the glass fiber, high strength, the glass fiber being fixed and excellent heat resistance, dimensional stability, electric insulation, impact resistance and flexibility, and according to these characteristics, the substrate having a low average linear expansion coefficient, high storage rigidity at high temperatures, and high surface uniformity and surface homogeneity can be obtained. In addition, the surface-treated fiber film has flexibility so that mechanical strength of the substrate is improved. Also, since it is a film using an organosilicon compound, it is also excellent in discoloration resistance. Further, it contains a white pigment so that it becomes a substrate having high reflectance. Moreover, by using a prepreg in an uncured state, the prepreg itself has a self-adhesive ability so that it is not necessary to provide an adhesive layer between the metal layer and the insulating layer, or between the laminated layers of the insulating layer, whereby it can be manufactured simply and easily. Therefore, the substrate of the present invention can be suitably used in the field requiring high heat resistance to which a high melting point lead-free solder has been applied, or in which a high performance device is used. Also, the semiconductor apparatus using such a substrate becomes a semiconductor apparatus having high performance, and can be suitably used as a material for devices which are required to carry out high density mounting, miniaturization and high performance.

DETAILED DESCRIPTION OF THE PREFERRED EMBODIMENTS

Figure 1:
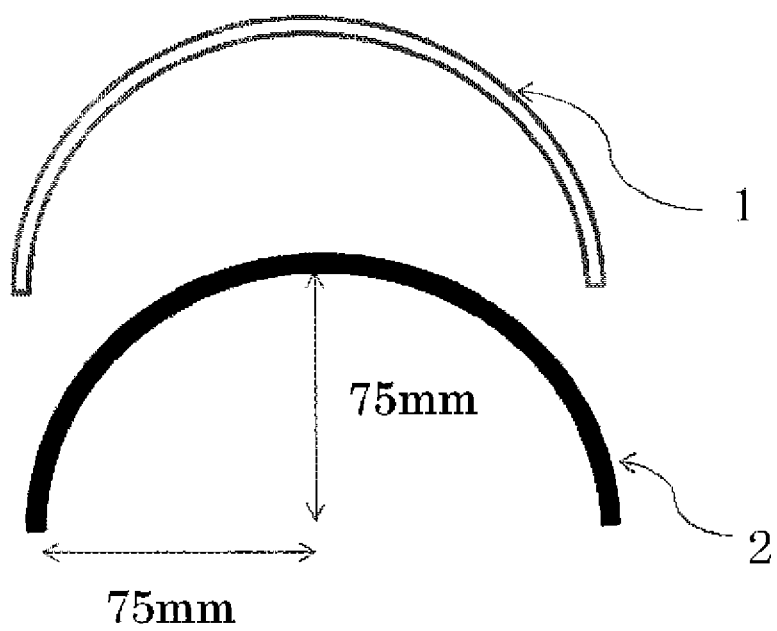
FIG. 1 is a sectional view of a semicylindrical shaped housing used at the flexibility test in the respective Examples and Comparative Examples.

In the conventional flexible substrate, there are defects in the fiber film to be used that "mechanical strength is weak so that for mounting a heavy part(s) thereon, it is necessary to support the film by other material(s); and thermal properties are poor", etc., whereby these are problems. The present inventors have found that, as a result of earnest investigation, when a substrate containing a surface-treated fiber film having a specific conventional flexural rigidity is used, the substrate is excellent in electric insulation, heat resistance, discoloration resistance, dimensional stability, impact resistance, flexibility, etc., and the above-mentioned problems can be solved by using the film as a material for the substrate, whereby the present invention has been accomplished.

In the following, the present invention is explained in detail, but the present invention is not limited by these.

The present invention is directed to a substrate which comprises a fiber film base material comprising a sheet of a surface-treated fiber film or a plural number of sheets of the surface-treated fiber films being laminated, wherein the surface-treated fiber film has a value of a conventional flexural rigidity measured by a method according to JIS R 3420 of 3-fold to 100-fold to a value of a conventional flexural rigidity of an untreated fiber film.

In the substrate of the present invention, the surface-treated fiber film has a role mainly as an insulating layer. The surface-treated fiber film may be suitably used a film state base material which is a glass cloth treated by an organic compound containing a silicon atom(s) (hereinafter referred to as an organosilicon compound). There may be specifically mentioned a material in which a part or whole of the glass fibers in the glass cloth are bundled by a cured product of an organosilicon compound and surface-treated by the same, and may include, for example, those disclosed in Patent Document 12. When such a surface-treated fiber film is employed, a part or whole of the fibers (filaments) constituting the glass cloth are bundled by the surface-treatment with the organosilicon compound, so that if it is used as a material for the substrate, a substrate which generates neither twisting nor unfastening, has excellent uniformity, homogeneity and self-standing property, no shear stress concentration at high temperatures, a low average linear expansion coefficient and excellent dimensional stability under high temperatures can be obtained.

Such a surface-treated fiber film has a value of a conventional flexural rigidity of a cloth measured by the method prescribed in JIS R 3420 of 3-fold to 100-fold to a value of a conventional flexural rigidity of an untreated fiber film. This multiple is used as an index showing the degree of changing from the so-called "woven fabric" state to the "film" state by surface-treating the fiber film, and is preferably 5-fold to 60-fold, more preferably 10-fold to 50-fold, and further preferably 10-fold to 40-fold.

If the above-mentioned value is less than 3-fold, dimensional stability or fixation of the glass fiber, i.e., preventing effects of unfastening and twisting which are aimed by the present invention can be hardly obtained, and electric insulation, heat resistance, weather resistance, etc., obtained by siloxane characteristics are insufficient. Also, if it exceeds 100-fold, the above-mentioned surface-treated fiber film becomes too hard, and flexibility of the substrate is impaired to generate cracks, etc.

When a glass cloth is used as the fiber film and an organosilicon compound is used for the surface treatment, to satisfy the above-mentioned characteristics, an attached amount of the organosilicon compound to the fiber film is preferably used in an amount of 2% by mass or more and 90% by mass or less based on 100% by mass of the surface-treated fiber film (the fiber film after the treatment), more preferably 5% by mass or more and 70% by mass or less, further preferably 10% by mass or more and 60% by mass or less.

If the attached amount is 2% by mass or more, the above-mentioned characteristics can be satisfied, and as a result, characteristics such as electric insulation, heat resistance, dimensional stability, self-standing property, etc., are good so that it is preferred. Also, if the attached amount is 90% by mass or less, electric insulation, dimensional stability, etc., can be obtained without lowering heat resistance or impairing flexibility so that it is preferred.

When a glass cloth is used in the present invention, it is possible to be fabric-opened by a columnar flow or a water flow by the high frequency vibration method. Further, the glass fiber adapted to the present invention may be used any glass fiber such as E glass, A glass, D glass, S glass, etc. E glass for general purpose is preferred in the point of a cost and easiness in availability, and when further higher characteristics are required (for example, low dielectric constant, high heat resistance, low impurities, etc.), quartz glass is preferred.

Such a glass cloth preferably has a weaving density of the fiber of 10 to 200 yarns/25 mm, more preferably 15 to 100 yarns/25 mm, and a mass of preferably 5 to 400 g/m$^2$, more preferably 10 to 300 g/m$^2$. If these values are within the above ranges, bundling by the surface treatment can be effectively done, and characteristics such as electric insulation, heat resistance, dimensional stability, self-standing property, etc., can be easily obtained.

The method of weaving of such a glass cloth may be used plain weave, satin weave, twill weave, mat weave (basket weave), etc. Also, it may be the glass fibers which are woven by the glass fibers in which one of them is processed to be textured or the both. Further, a 3-spindle braided glass fiber becomes a surface-treated fiber film having higher strength and reliability. Moreover, it is also possible to use a woven fabric in which unwoven fabric or long fiber is orientated in one direction. In addition, when a bundling agent is coated onto the glass cloth, it is desired that the agent is previously removed since the treatment by the organosilicon compound is sometimes inhibited.

In the present invention, woven fabric using fiber including inorganic fiber such as carbon fiber, ceramic fiber, etc.; metal fiber such as boron fiber, steel fiber, tungsten fiber, etc.; novel heat resistant fiber such as aramid fiber, phenol fiber, etc., may be also applicable in place of the glass fiber.

The organosilicon compound to be used for the surface treatment of the above-mentioned glass cloth may be mentioned one or more compounds selected from the group consisting of an alkoxysilane, a polysilazane and a partially hydrolyzed condensate thereof, a silicone-modified varnish and an addition curing type silicone resin.

The alkoxysilane may be mentioned, for example, a tetraalkoxysilane such as tetramethoxysilane, tetraethoxysilane, etc.; an alkylalkoxysilane such as trimethylmethoxysilane, trimethylethoxysilane, dimethyldimethoxysilane, dimethyldiethoxysilane, methyltrimethoxysilane, methyltriethoxysilane, n-propyltriethoxysilane, hexyltrimethoxysilane, octyltriethoxysilane, decyltrimethoxysilane, 1,6-bis(trimethoxysilyl)hexane, etc.; an arylalkoxysilane such as methylphenyldimethoxysilane, methylphenyldiethoxysilane, diphenyldimethoxysilane, diphenyldiethoxysilane, phenyltrimethoxysilane, phenyltriethoxysilane, p-styryltrimethoxysilane, etc.; a hydroxyalkoxysilane such as hydroxytrimethoxysilane, hydroxytriethoxysilane, etc.; an alkenylalkoxysilane such as vinyltrimethoxysilane, vinyltriethoxysilane, etc.; an epoxy group-containing alkoxysilane such as 3-glycidoxypropyltrimethoxysilane, 3-glycidoxypropylmethyldimethoxysilane, 3-glycidoxypropyltriethoxysilane, 3-glycidoxypropylmethyldiethoxysilane, 2-(3,4-epoxycyclohexyl)ethyltrimethoxysilane, etc.; a (meth)acrylic group-containing alkoxysilane such as 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, etc.; an amino group-containing alkoxysilane such as N-2-(aminoethyl)-3-aminopropyltrimethoxysilane, N-2-(aminoethyl)-3-aminopropylmethyldimethoxysilane, 3-aminopropyltrimethoxysilane, 3-aminopropyltriethoxysilane, N-phenyl-3-aminopropyltrimethoxysilane, 3-allylaminopropyltrimethoxysilane, N—(N-vinyibenzyl)-2-aminoethyl-3-aminopropyltrimethoxysilane and its hydrochloride, N—(N-vinylbenzyl)-2-aminoethyl-3-aminopropylmethyldimethoxysilane and its hydrochloride, etc.; an isocyanatealkoxysilane such as 3-isocyanatepropyltriethoxysilane, tris-(trimethoxysilylpropyl)isocyanurate, etc.; and an alkoxysilane compound such as 3-ureidopropyltriethoxysilane, 3-chloropropyltrimethoxysilane, 3-mercaptopropyltrimethoxysilane, 3-mercaptopropylmethyldimethoxysilane, bis(trisethoxysilylpropyl)tetrasulfide, etc., and these alkoxysilanes may be used with a single kind or two or more in admixture. The alkoxysilane is not limited by the above-mentioned materials.

In addition, a partially hydrolyzed condensate of one kind or two or more kinds of the above-mentioned alkoxysilanes may be used. The partially hydrolyzed condensate thereof may be optionally prepared by adding a conventionally known condensation catalyst, or a commercially available product may be used. Examples of the commercially available product may be mentioned an epoxy group-containing alkoxysilane oligomer X-41-1059A (available from Shin-Etsu Chemical Co., Ltd.) and an amino group-containing alkoxysilane oligomer X-40-2651 (available from Shin-Etsu Chemical Co., Ltd.), etc.

The polysilazane may be mentioned a compound such as 1,1,3,3-tetramethyldisilazane, hexamethyldisilazane, 1,3-divinyl-1,1,3,3-tetramethyldisilazane, 1,1,3,3,5,5-hexamethylcyclotrisilazane, etc., but the invention is not limited by these.

The silicone-modified varnish may be mentioned various silicone-modified varnishes such as an alkyd-modified varnish, a polyester-modified varnish, an epoxy-modified varnish, an acryl-modified varnish, etc., and it may be optionally selected depending on the final use or the object thereof.

A preferred organosilicon compound may be mentioned an alkoxysilane and a partially hydrolyzed condensate thereof. Among these, a preferred alkoxysilane may be selected from methyltrimethoxysilane and a type generally called as a silane coupling agent which is an alkoxysilane having a functional group. It may be exemplified by a silane coupling agent, for example, vinyltrimethoxysilane, 3-glycidoxypropyltrimethoxysilane, 3-aminopropyltrimethoxysilane, etc.

A partially hydrolyzed condensate of the alkoxysilane is also a preferred organosilicon compound. In particular, an alkoxysilane oligomer having both of the functional group and the alkoxysilyl group which is partially hydrolysis condensed the above-mentioned silane coupling agent is a preferred organosilicon compound.

As the addition curing type silicone resin, a composition comprising an unsaturated group-containing organopolysiloxane which comprises a $SiO_2$ unit, an $R^1SiO_{1.5}$ unit, an $R^1_{2-q}R^2_qSiO$ unit and an $R^1_{3-r}R^2_rSiO_{0.5}$ unit (here, q=0 to 2 and r=0 to 3), an organopolysiloxane containing at least one of a hydrosilyl group(s) and a platinum catalyst with an amount effective for curing is used, and may be optionally selected depending on the final uses and objects.

Incidentally, the above-mentioned $R^1$ is a monovalent saturated hydrocarbon group having 1 to 10 carbon atoms, or a monovalent aromatic hydrocarbon group, $R^2$ is a monovalent unsaturated hydrocarbon group having 2 to 8 carbon atoms; at least one of which contains $R^2$, and in the saturated group-containing organopolysiloxane, it has a $SiO_2$ unit or an $R^1SiO_{1.5}$ unit. It is particularly preferable that $R^1$ be a methyl group, an ethyl group, a propyl group, a cyclohexyl group or a phenyl group, and $R^2$ be a vinyl group or an allyl group. By containing the $SiO_2$ unit or the $R^1SiO_{1.5}$ unit as an essential component, it is possible to firmly fix the fiber while suppressing brittleness.

The above-mentioned surface-treated fiber film may contain a filler, if necessary. The filler may be used as a single kind alone or two or more kinds in combination. The filler may be added for the purpose of lowering a linear expansion coefficient, and improving thermal conductivity or strength of the substrate. The filler may be any material so long as it is a conventionally known filler, and may be mentioned, for example, silica such as precipitated silica, fumed silica, fused silica, fused spherical silica, crystalline silica, etc., fumed titanium dioxide, zinc oxide, silicon nitride, aluminum nitride, boron nitride, antimony trioxide, alumina, zirconium oxide, zinc sulfide, magnesium oxide, barium sulfate, etc.

A formulation amount of the filler when an organosilicon compound is used for the surface treatment is preferably in the range of 900 parts by mass or less (0 to 900 parts by mass) per 100 parts by mass of the organosilicon compound from the viewpoints of a linear expansion coefficient and strength of the resulting substrate, more preferably in the range of 600 parts by mass or less (0 to 600 parts by mass), further preferably in the range of 10 to 600 parts by mass, particularly preferably in the range of 50 to 500 parts by mass.

The above-mentioned filler may further contain a white pigment, if necessary. Such a white pigment is added to a composition (for example, an organosilicon compound) for the surface treatment for the purpose of heightening light reflectance of the substrate when the resulting substrate is required to reflect light, but for obtaining a substrate which is not particularly required to reflect light, it may not be added in some cases. Here, the terms "the substrate is required to reflect light" mean the case where light reflectance of the substrate is required to be preferably 80% or more (i.e., 80 to 100%) over the entire visible light region.

The white pigment to be used in the present invention may be used any material so long as it has been conventionally and generally used well known white pigment without any limitation, and suitably mentioned titanium dioxide, zirconium oxide, zinc sulfide, zinc oxide, magnesium oxide, barium sulfate, etc., which may be used two or more kinds in combination. Among the above-mentioned white pigments, titanium dioxide, alumina and magnesium oxide are more preferred, and titanium dioxide is further more preferred. A crystalline form of the titanium dioxide may be any of the rutile type, the anatase type or the brookite type, and the rutile type is preferably used.

An average particle diameter and a shape of the white pigment are not particularly limited, and the average particle diameter is preferably 0.05 to 10.0 μm, more preferably 0.1 to 5.0 μm, further preferably 0.1 to 1.0 μm. Incidentally, the average particle diameter can be obtained as a mass average value $D_{50}$ (or a median diameter) in the particle diameter distribution measurement by the laser beam diffraction method. The white pigment component may be used as a single kind alone or two or more kinds in combination.

A formulation amount of the white pigment when an organosilicon compound is used for the surface treatment is preferably 1 to 300 parts by mass based on 100 parts by mass of the total amount of the organosilicon compound, more preferably 3 to 200 parts by mass, particularly preferably 10 to 150 parts by mass. If the formulation amount is 1 part by mass or more, it is preferred since whiteness of the cured product of the resulting silicone resin composition is sufficient. If the formulation amount is 300 parts by mass or less, it is preferred since a ratio of an inorganic filler mentioned below which is to be added for the purpose of lowering a linear expansion coefficient of the substrate of the present invention and improving mechanical strength of the substrate based on the entire filler is not lowered.

The inorganic filler represents a filler other than the white pigment, and is added for the purpose of lowering a linear expansion coefficient of the substrate of the present invention as well as improving mechanical strength of the substrate and improving thermal conductivity of the same. The component of the inorganic filler may be any material so long as it is a conventionally known inorganic filler, and may be mentioned, for example, silica such as fused silica, fused spherical silica, crystalline silica, etc., alumina, silicon nitride, aluminum nitride, boron nitride, antimony trioxide, etc., and fused silica, fused spherical silica and alumina are particularly preferred. The component of the inorganic filler may be used as a single kind alone or two or more kinds in combination.

An average particle diameter and a shape of the inorganic filler component are not particularly limited. The average particle diameter of the inorganic filler component is generally 0.5 to 50 μm, and in view of moldability and flowability of the organosilicon compound to be used for the surface treatment, it is preferably 1 to 10 μm, further preferably 1 to 5 μm. Incidentally, the average particle diameter can be obtained as a mass average value $D_{50}$ (or a median diameter) in the particle diameter distribution measurement by the laser beam diffraction method as mentioned above.

A formulation amount of the inorganic filler component when an organosilicon compound is used for the surface treatment is preferably in the range of 600 parts by mass or less (0 to 600 parts by mass) based on 100 parts by mass of the total amount of the organosilicon compound from the viewpoints of a linear expansion coefficient and strength of the resulting substrate, more preferably 10 to 600 parts by mass, further preferably in the range of 50 to 500 parts by mass.

Also, there are materials which can be both of the above-mentioned white pigment and the inorganic filler, i.e., materials which can be used as the white pigment as well as the inorganic filler, which may be specifically mentioned titanium dioxide, alumina, silica, etc.

A linear expansion coefficient in the X-Y direction of the surface-treated fiber film in the present invention is preferably 20 ppm/° C. or less, more preferably 15 ppm/° C. or less. As the measurement method of the linear expansion coefficient in the X-Y direction, there may be mentioned a measurement method in which a sample was cut in a size of a width of 3 mm, a length of 25 mm and a thickness of 50 to 300 mm, and subjected to a tensile test using a thermomechanical analysis (TMA) apparatus in the temperature range of from −60° C. to 200° C. with a temperature raising rate of 5° C./rain while applying a load of 100 mN. If the linear expansion coefficient thereof is 20 ppm/° C. or less, i.e., since it is a low linear expansion coefficient, thermal impact resistance is high, and it can be used as a high strength substrate, so that it can corresponds to the demands to the printed substrate such as high density mounting and miniaturization. It can be also used as an electric insulation and heat resistance film for a space purpose or in the field of a transport aircraft which are used under severe conditions.

Incidentally, a linear expansion coefficient of a polyether imide film which is a general highly heat resistant engineering plastic film is about 50 ppm/° C. To the contrary, if the surface-treated glass fiber film of the present invention has the above-mentioned linear expansion coefficient, a film having excellent heat resistance as well as a low linear expansion coefficient can be provided.

As a manufacturing method of the surface-treated fiber film, a general treating method of a glass fiber can be applied. For example, as the glass fiber, in the case of the type to which a bundling agent has been attached, it is used after removing the agent by the conventionally known manner, or a glass fiber in which a bundling agent as previously been removed is obtained and used.

Suitable examples of the coating solution to be used for the surface treatment may be mentioned, in general, a solution in which water or an organic solvent such as alcohols, ketones, glycol ethers, hydrocarbon non-polar solvents such as toluene, xylene, hexane, heptane, etc.; ethers, etc., is added to an alkoxysilane, and further, a pH adjusting agent such as formic acid, acetic acid, propionic acid, oxalic acid, aqueous ammonia, etc.; a pigment, a dye, a filler, a surfactant, a thickener, etc., may be added. Also, to promote the curing, a condensation catalyst of an alkoxy group, for example, various kinds of organometallic compounds or amine compounds, etc., may be added. Further, a solution to which the above-mentioned filler has been added may be prepared as a solution or a dispersion, if necessary.

In this case, an aqueous type coating solution is preferred in consideration for the coating environment. KBM-903 (available from Shin-Etsu Chemical Co., Ltd.) which is a silane coupling agent, etc., is excellent in stability in an aqueous system and has good solubility so that it is a preferred organosilicon compound.

As a coating method of the coating solution to the fiber film in the present invention, a general coating method (coating system) of the glass fiber is applied. As a representative coating system, there are a direct gravure coater, a chamber doctor coater, an offset gravure coater, a roll-kiss coater, a reverse kiss coater, a bar coater, a reverse roll coater, a slot die, an air doctor coater, a normal rotation roll coater, a blade coater, a knife coater, a dip coater, an MB coater, an MB reverse coater, etc. Among these, a direct gravure coater, offset coater, and a dip coater coating system are preferred for manufacturing the surface-treated fiber film.

While the conditions may vary depending on the organosilicon compound to be used, drying after coating, heat treatment at room temperature to 300° C. for 1 minute to 24 hours may be added for the purpose of curing. The surface-treated fiber film is manufactured by the heat treatment done preferably at room temperature to 250° C. for 3 minutes to 4 hours, more preferably at room temperature to 230° C. for 5 minutes to 1 hour considering productivity, a cost and workability, etc.

The coating solution is, for example, a solution in which the above-mentioned organosilicon compound is diluted with a solvent. Examples of the solvent may be mentioned water and an organic solvent, and used a single kind or two or more kinds in admixture. Examples of the organic solvent may be mentioned alcohols such as methanol, ethanol, isopropanol, n-butanol, etc.; ketones such as acetone, methyl ethyl ketone, methyl isobutyl ketone, etc.; glycol ethers such as ethylene glycol, propylene glycol, etc.; aliphatic hydrocarbons such as hexane, heptane, etc.; aromatic hydrocarbons such as toluene, xylene, etc.; ethers such as diethyl ether, diisopropyl ether, di-n-butyl ether, etc. It is also possible to further add an organic acid such as formic acid, acetic acid, propionic acid, oxalic acid, etc.; a pH adjusting agent such as aqueous ammonia, etc.; a pigment, a filler, a surfactant, a thickener, etc., to the diluted solution.

In addition, an alkoxy group condensation catalyst may be added, and it may be mentioned, for example, an organometallic compound catalyst such as an organotin compound, an organotitanium compound and an organobismuth compound, and an amine compound, etc.

The organometallic compound condensation catalyst may be mentioned metallic Lewis acids, etc. Illustrative example thereof includes an organotin compound such as dibutyltin dimethoxide, dibutyltin diacetate, dibutyltin dioctoate, dibutyltin dilaurate, dibutyltin bis(acetylacetonato), dibutyltin bis(benzylmaleate), dimethyltin dimethoxide, dimethyltin diacetate, dioctyltin dioctoate, dioctyltin dilaurate, tin dioctoate and tin dilaurate, etc., an organotitanium compound such as tetra-isopropyl titanate, tetra-normal-butyl titanate, tetra-tertiary-butyl titanate, tetra-normal-propyl titanate, tetra-2-ethylhexyl titanate, diisopropyl-di-tertiary-butyl titanate, dimethoxy titanium bisacetylacetonato, diisopropoxy titanium bisethylacetoacetate, di-tertiary-butoxy titanium bisethylacetoacetate and di-tertiary-butoxy titanium bismethylacetoacetate, etc., an organobismuth compound such as bismuth tris(2-ethylhexanoate) and bismuth tris(neodecanoate), etc., and these may be used as a single kind alone or two or more kinds in combination. Examples of the amine compound may be mentioned hexylamine, di-2-ethylhexylamine, N,N-dimethyldodecylamine, di-n-hexylamine, dicyclohexylamine, di-n-octylamine, hexamethoxymethylmelamine, etc.

Among these condensation catalysts, an organotitanium compound is particularly preferred.

The surface-treated fiber film to be used in the present invention preferably does not have a glass transition point at least at 250° C. or lower, particularly preferably does not have a glass transition point at 300° C. or lower. If the film does not have a glass transition point at 250° C. or lower, a substrate which is excellent in heat resistance and in which warpage is suppressed at high temperature can be obtained, whereby it is possible to meet the demand of high-density mounting and miniaturization of the printed substrate. Also, according to the above, a substrate excellent in heat resistance and electric insulation can be provided.

In such a surface-treated fiber film, coating on the surface of the fiber and impregnation into inside of the fiber have been done by the organosilicon compound, etc., and it is excellent in heat resistance, dimensional stability, light resistance, weather resistance, etc. In addition, a self-standing property which had not been possessed by the untreated fiber film has been provided, and the fiber is fixed so that the film becomes uniform and homogeneous, which does not cause the problems such as twisting or unfastening of the fiber, etc.

When the above-mentioned surface-treated fiber film is to be used as a substrate, a sheet of the surface-treated fiber film, or a laminate in which a plural number of the films are laminated may be used. The surface-treated fiber film is preferably one sheet from the viewpoints of flexibility and heat resistance.

Also, in the substrate of the present invention, a metal layer(s) is/are provided on one surface or both surfaces of the above-mentioned surface-treated fiber film or a laminate thereof to prepare a metal clad surface-treated fiber substrate.

The metal layer(s) to be used in the present invention is preferably formed by metal plating, a metal foil or a metal plate. In particular, by using a metal plating or a metal foil, flexibility of the substrate can be maintained, and the substrate which is bendable at 90° or more can be easily obtained. On the other hand, by using the metal plate, heat dissipation of the substrate is heightened, and a substrate having high heat resistance can be obtained.

When metal plating is carried out, it can be done according to the conventional manner and is not particularly limited. There may be mentioned, for example, a method in which a metal coating layer is formed on the fiber film by the electroless plating method. The metal film layer to be formed is preferably selected from Ni, Cu, Fe, Co or an alloy comprising two or more metals mentioned before, for example, a Ni—Cu alloy, a Fe—Ni alloy, a Fe—Co alloy, etc. Also, after the electroless plating, the film may be thickened by electrolytic plating.

As a method of forming a pattern by plating, there may be mentioned, for example, a method in which electroless plating is carried out to the glass fiber to laminate a dry film, then, an optional pattern is formed thereon by exposure and development, further electrolytic plating is carried out to complete the pattern, whereby a metal clad surface-treated fiber substrate on which a pattern has been formed by plating can be obtained.

The metal foil or the metal plate to be used in the present invention may be any material if it is a conventionally known metal foil or metal plate. The metal foil which can be used may be mentioned, for example, a metal foil made of copper, gold, silver, aluminum, nickel, tin, etc., having a thickness of about 5 to 70 μm. Among these, the metal foil is preferably those which have been used as a conductive foil, and a copper foil is generally used, further a foil the surface of which had been subjected to a chemical conversion treatment such as a black oxidization treatment, etc., may be suitably used. The conductive foil preferably used is a foil in which the contacting surface (the surface to be overlapped) with the film has previously been subjected to a chemically or mechanically roughening treatment to heighten the adhesive effect. Specific examples of the conductive foil which has been subjected to the surface roughening treatment may be mentioned a roughened copper foil which has been electrochemically treated when an electrolytic copper foil is manufactured, etc.

The metal plate may be mentioned, for example, a copper plate, an aluminum plate, a ceramic plate, etc. Incidentally, a thickness of the metal plate is not particularly limited. By using the metal plate, it is possible to improve heat dissipation. Also, in the point of improving heat dissipation, a thickness of the surface-treated fiber film is preferably thin. In particular, the fiber film of the present invention has flexibility and high mechanical strength, and insulation can be maintained even when it is a thin film, so that it is useful as a high heat dissipation substrate.

As a method of providing a metal foil or a metal plate onto the surface-treated fiber film, a method generally used may be used without any specific limitation. For example, there may be mentioned a method in which a metal foil or a metal plate is laminated on at least one surface of the surface-treated fiber film. The laminating method may be mentioned a pressing method, a laminating method, etc. Conditions of the pressing method and the laminating method may be optionally selected depending on the characteristics of the surface-treated fiber film. After laminating them, a patterning and a plating process are carried out in accordance with the ordinary method to obtain a printed wiring substrate.

Also, in the present invention, an adhesive layer comprising an adhesive resin composition may be present between the surface-treated fiber film and the metal layer, between the surface-treated fiber films with each other, or both of these, if necessary, and as the adhesive resin composition, a thermosetting resin is preferably used. When such a metal clad surface-treated fiber substrate is used, a substrate excellent in heat resistance and discoloration resistance and having high mechanical strength can be obtained since a thermosetting resin is used as the adhesive layer.

The thermosetting adhesive resin composition may be any resin composition so long as it is a conventionally known thermosetting resin composition and has an adhesion, and may be mentioned, for example, a silicone resin, an epoxy resin, a phenol resin, etc., in particular, a silicone resin and an epoxy resin are preferably used.

The thermosetting adhesive resin composition may contain a filler, if necessary. The filler may be used as a single kind alone or two or more kinds in combination. The filler can be added for the purpose of lowering a linear expansion coefficient and improving thermal conductivity or strength of the metal clad surface-treated fiber substrate. The filler may be any material so long as it is a conventionally known filler, and the filler described in the surface-treated fiber film mentioned above is preferably used.

Also, in the present invention, an adhesion-improving treatment may be applied to at least one of the fiber film and the adhesive layer to improve adhesion between the surface-treated fiber film and the adhesive layer. The adhesion-improving treatment may be mentioned a discharge treatment such as a normal pressure plasma treatment, a corona discharge treatment, a low temperature plasma treatment, etc.; a surface swelling treatment by an alkali, a desmear treatment by permanganic acid, a primer treatment by a silane coupling agent, etc.

The adhesive layer is formed on the surface-treated fiber film by using, for example, at least one of the laminating method, the dip method, the spray coating method and the bar coating method, and the laminating method and the dip method are particularly preferably used.

An embodiment of the manufacturing method of the metal clad surface-treated fiber substrate according to the present invention is explained, but the present invention is not limited by these.

First, a glass fiber is surface-treated by an organosilicon compound, and cured by heating to obtain a surface-treated fiber film. Metal foils are superimposed onto the both surfaces of a sheet of the surface-treated fiber film or a laminate thereof in which a plural number of films are laminated, and an adhesive layer(s) is/are provided between them depending on necessity and molded under heating and pressure to obtain a metal clad surface-treated fiber substrate. Incidentally, the first process of curing by heating may be omitted.

When such a metal clad surface-treated fiber substrate is employed, there is neither unfastening nor twisting of the fiber in the insulating layer, which is uniform and homogeneous, and a strain of which has been suppressed, further excellent in heat resistance and dimensional stability, whereby a substrate having high reliability in which warpage at high temperature is suppressed can be obtained. In addition, it is excellent in discoloration resistance, deterioration, discoloration and lowering in reflectance by heating are low.

The above-mentioned metal clad surface-treated fiber substrate can be made a semiconductor apparatus by, for example, a semiconductor device(s) is/are mounted on a substrate. As mentioned above, since the metal clad surface-treated fiber substrate has neither unfastening nor twisting of the glass fiber, a substrate having high strength in which the glass fiber has been fixed and having excellent heat resistance, discoloration resistance and dimensional stability, and high surface uniformity can be obtained, so that it can be applied to a semiconductor apparatus requiring high heat resistance to which a lead-free solder, etc., has been applied, or a high performance semiconductor apparatus. In addition, the surface-treated fiber film has flexibility so that mechanical strength of the substrate is improved whereby it can be applied as a flexible substrate.

The substrate of the present invention can be made a composite laminated substrate containing a sheet of the prepreg using the surface-treated glass fiber film, or a plural number of the prepregs being laminated, and further, it can be made a metal clad composite laminated substrate comprising the above-mentioned prepreg or the laminate thereof having a metal layer(s) on one surface or both surfaces thereof.

The metal clad composite laminated substrate of the present invention uses the prepreg in which the surface-treated glass fiber film is used as an insulating layer. The surface-treated glass fiber film to be used for the prepreg preferably comprises a film in which a glass cloth comprising a glass fiber is surface-treated and processed to a film. There may be specifically mentioned a film in which a part or all of the glass fiber in the glass cloth are bundled and surface-treated by a cured product of the organosilicon compound.

In the present invention, the thermosetting resin composition to be coated onto the surface-treated glass fiber film to be used at the time of preparing the prepreg may be any resin composition so long as it is a conventionally known thermosetting resin composition, and may be mentioned, for example, a silicone resin composition, an epoxy resin composition, a phenol resin composition, etc., preferably a silicone resin composition or an epoxy resin composition, further preferably a silicone resin composition. When a silicone resin composition is used, a highly heat resistant substrate excellent in heat resistance and discoloration resistance can be obtained.

The silicone resin composition to be used under this embodiment preferably contains the following Components (A) to (C):

(A) an organopolysiloxane represented by the following average composition formula,

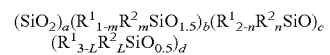

$$(SiO_2)_a(R^1_{1-m}R^2_mSiO_{1.5})_b(R^1_{2-n}R^2_nSiO)_c(R^1_{3-L}R^2_LSiO_{0.5})_d$$

wherein $R^1$ represents a monovalent saturated hydrocarbon group having 1 to 10 carbon atoms or a monovalent aromatic hydrocarbon group having 6 to 12 carbon atoms; $R^2$ represents a monovalent unsaturated hydrocarbon group having 2 to 8 carbon atoms; m=0 to 1, n=0 to 2, L=0 to 3, and $1 \le m+n+L \le 6$, and "a", "b", "c" and "d" are numbers each satisfying $0 \le a \le 1$, $0 \le b \le 1$, $0 \le c \le 0.9$, $0 \le d \le 0.9$, a+b>0, and a+b+c+d=1, (B) a hydrogen polysiloxane containing one or more hydrosilyl groups, and (C) a platinum based catalyst in an amount effective for curing.

When the above-mentioned a silicone resin composition contains a $SiO_2$ unit or an $R^1_{1-m}R^2_mSiO_{1.5}$ unit, a prepreg in an uncured state and a metal clad composite laminated substrate being firm without brittleness can be obtained.

Also, the above-mentioned silicone resin composition is preferably in a solid state or a semi-solid state at room temperature. In the present invention, the terms "room temperature" mean the range of 15 to 30° C., and the terms "semi-solid" mean the state of a substance in which it has plasticity and can maintain the shape for at least 1 hour, preferably 8 hours or longer when it is molded to a specific shape. Accordingly, for example, when a flowable substance which has an extremely high viscosity at normal temperature essentially has flowability but change (i.e., collapse) in the provided shape cannot be admitted by naked eyes within a short time of at least 1 hour due to the extremely high viscosity, then the substance is in a semi-solid state.

Thus, since the silicone resin composition is in a solid state at room temperature, when it is coated onto the surface-treated glass fiber film and dried, it is still in a solid even when it is in an A-stage state, so that there are merits that storage of the prepreg in an uncured state is easier, molding by a hot pressing apparatus can be carried out easier, and a shape of the metal clad composite laminated substrate can be molded more freely.

Here, the organopolysiloxane of Component (A) contained in the silicone resin composition is explained.

In Component (A), $R^1$ is a monovalent saturated hydrocarbon group having 1 to 10 carbon atoms, or a monovalent aromatic hydrocarbon group having 6 to 12 carbon atoms, and specific examples thereof may be mentioned an alkyl group such as a methyl group, an ethyl group, a propyl group, an isopropyl group, a butyl group, an isobutyl group, a cyclohexyl group, etc., or an aryl group such as a phenyl group, a tolyl group, a xylyl group, a naphthyl group, etc. Among these, a methyl group and a phenyl group are particularly preferred.

Also, $R^2$ is a monovalent unsaturated hydrocarbon group having 2 to 8 carbon atoms, and specific examples thereof may be mentioned an alkenyl group such as a vinyl group, an allyl group, a propenyl group, an isopropenyl group, etc. Among these, a vinyl group is preferred.

Specific examples of Component (A) may be mentioned an organopolysiloxane having an $R^1_{1-m}R^2_m SiO_{1.5}$ unit, an $R^1_{2-n}R^2_n SiO$ unit, and an $R^1_{3-m}R^2_m SiO_{0.5}$ unit mentioned below:

$(PhSiO_{1.5})_{e1}(Me_2SiO)_f(Me_2ViSiO_{0.5})_{G1}$ $(PhSiO_{1.5})_{e1}(Me_2SiO)_f(MeVi_2SiO_{0.5})_{G1}$ $(PhSiO_{1.5})_{e2}(Me_2SiO)_H(MeViSiO)_i(Me_2ViSiO_{0.5})_{G2}$ wherein "e1", "e2", "f", G1, G2, H and "i" are numbers each satisfying 0.24≤(e1 and e2)≤0.9, 0.09≤f≤0.75, 0.01≤(G1 and G2)≤0.5, 0.01≤H≤0.74, 0.01≤i≤0.74 and e1+f+G1=1 or e2+H+i+G2=1, and it is particularly preferable that at least a part or all of the above-mentioned Me₂SiO units be comprised continuously and repeatedly to provide flexibility of the resin;

or an organopolysiloxane having an $R^1_{1-m}R^2_m SiO_{1.5}$ unit alone:

$(PhSiO_{1.5})_j(ViSiO_{1.5})_k$ $(MeSiO_{1.5})_j(ViSiO_{1.5})_k$ wherein "j" and "k" are numbers each satisfying 0.5≤j≤0.95, 0.05≤k≤0.5 and j+k=1;

or an organopolysiloxane having a SiO₂ unit and an $R^1_{3-L}R^2_L SiO_{0.5}$ unit:

$(SiO_2)_s(Me_3SiO_{0.5})_{t1}(MePhViSiO_{0.5})_{t2}$ wherein "s", "t1" and "t2" are numbers each satisfying 0.25≤s≤0.77, 0.02≤t1≤0.12, 0.18≤t2≤0.73 and s+t1+t2=1; and the like, but the present invention is not limited by these.

Incidentally, in the above-mentioned respective formulae, Me represents a methyl group, Ph represents a phenyl group and Vi represents a vinyl group. Also, the above-mentioned organopolysiloxane may be used a single kind or two or more kinds in combination.

Also, the weight average molecular weight of Component (A) in terms of a polystyrene is preferably in the range of 1,000 to 1,000,000. If the weight average molecular weight is within the range, the resin is in a solid state or a semi-solid state at room temperature whereby it is suitable in view of workability and curability.

Component (A) having such a resin structure can be synthesized by combining compounds which become starting materials of the respective units such that the respective siloxane units became required molar ratios in the produced polymer and, for example, subjecting to cohydrolysis condensation in the presence of an acid.

Here, as the starting materials of the respective siloxane units, there may be exemplified by chlorosilanes corresponding to the respective siloxane units, alkoxysilanes such as methoxysilanes corresponding to the respective chlorosilanes, etc.

Next, a hydrogen polysiloxane of Component (B) contained in the silicone resin composition is explained.

Component (B) preferably contains one or more hydrosilyl groups.

Specific examples of Component (B) may be mentioned hydrogen polysiloxanes exemplified below, but the invention is not limited by these. Also, the hydrogen polysiloxane may be used a single kind or two or more kinds in combination.

$(PhSiO_{1.5})_{u1}(Me_2SiO)_v(Me_2HSiO_{0.5})_{w1}$ $(PhSiO_{1.5})_{u2}(Me_2SiO)_x(MeHSiO)_y(Me_2HSiO_{0.5})_{w2}$ $(PhSiO_{1.5})_{u3}(MeHSiO)_v$ $(MeSiO_{1.5})_{u4}(MeHSiO)_v$ $(Me_2HSiO_{1/2})_2(Ph_2SiO_{2/2})_z$ wherein "u1", "u2", "u3", "u4", "v", "w1", "w2", "x", "y" and "z" are numbers each satisfying 0.24≤(u1, u2, u3 and u4)≤0.9, 0.09≤v≤0.75, 0.01≤(w1 and w2)≤0.5, 0.01≤x≤0.74, 0.01≤y≤0.74, z is an integer of 1 to 10 and, u1+v+w1=1, u2+x+y+w2=1, u3+x=1, or u4+y=1.

A formulation amount of Component (B) is preferably such an amount that a hydrogen atom bonded to the silicon atom (SiH group) of Component (B) based on the total of the monovalent unsaturated hydrocarbon groups of the above-mentioned Component (A) becomes 0.1 to 4.0 in a molar ratio, particularly preferably an amount which becomes 0.5 to 3.0, further preferably an amount which becomes 0.8 to 2.0. If it is 0.1 or more, the curing reaction proceeds smoothly, and a silicone cured product can be obtained easily, while if it is 4.0 or less, a remaining amount of the unreacted SiH group in the cured product can be made little, and change in characteristics of the cured product with a lapse of time can be suppressed so that the range is preferred.

In the present invention, one of or both of Component (A) and Component (B) preferably contains a silanol group to provide adhesion. An amount of the siloxane unit having a silanol group in Component (A) and Component (B) is preferably about 10 mole % or less (0 to 10 mole %) based on the entire siloxane units.

The platinum group metallic catalyst of Component (C) to be used in the silicone resin composition is to be formulated to generate addition curing reaction of the above-mentioned silicone resin composition, and there are platinum based, palladium based and rhodium based catalysts. As such a catalyst, any of the catalysts which have conventionally been known as a catalyst to promote the hydrosilylation reaction may be used. Considering the cost, etc., there may be exemplified by a platinum based such as platinum, platinum black, chloroplatinic acid, etc., for example, $H_2PtCl_6 \cdot pH_2O$, $K_2PtCl_6$, $KHPtCl_6 \cdot pH_2O$, $K_2PtCl_4$, $K_2PtCl_4 \cdot pH_2O$, $PtO_2 \cdot pH_2O$, $PtCl_4 \cdot pH_2O$, $PtCl_2$, $H_2PtCl_4 \cdot pH_2O$ (wherein "p" is a positive integer), etc., and a complex of the above with a hydrocarbon such as an olefin, an alcohol or a vinyl group-containing organopolysiloxane, etc. These catalysts may be used a single kind alone or two or more kinds in combination.

A formulation amount of the platinum group metallic catalyst may be an effective amount for curing, and in general, it is 0.1 to 500 ppm in terms of a mass as the platinum group metal based on the total amount of Component (A) and Component (B), particularly preferably in the range of 0.5 to 100 ppm.

The thermosetting resin composition exemplified by the above-mentioned silicone resin composition may contain a filler, if necessary. The filler may be used as a single kind alone or two or more kinds in combination. The filler may be added for the purpose of lowering a linear expansion coefficient, and improving thermal conductivity or strength of the metal clad composite laminated substrate. The filler may be any material so long as it is a conventionally known filler, and may be mentioned, for example, silica such as precipitated silica, fumed silica, fused silica, fused spherical silica, crystalline silica, etc., fumed titanium dioxide, zinc oxide, silicon nitride, aluminum nitride, boron nitride, antimony trioxide, alumina, zirconium oxide, zinc sulfide, magnesium oxide, barium sulfate, etc.

A formulation amount of the filler is preferably in the range of 900 parts by mass or less (0 to 900 parts by mass) based on 100 parts by mass of the total amount of the thermosetting resin composition from the viewpoints of a linear expansion coefficient and strength of the resulting metal clad composite laminated substrate, more preferably in the range of 600 parts by mass or less (0 to 600 parts by mass), further preferably 10 to 600 parts by mass, particularly preferably in the range of 50 to 500 parts by mass.

The filler may contain the white pigment or both components of the white pigment and the inorganic filler. The white pigment may be added to the thermosetting resin composition for the purpose of heightening light reflectance of the metal clad composite laminated substrate, when the resulting metal clad composite laminated substrate is required to reflect light, but for obtaining a metal clad composite laminated substrate which is not particularly required to reflect light, it may not be added to the thermosetting resin composition. Here, the terms "the metal clad composite laminated substrate is required to reflect light" mean the case where light reflectance of the metal clad composite laminated substrate is required to be preferably 80% or more (i.e., 80 to 100%) over the entire visible light region.

The white pigment which can be used in the present invention may be used any material so long as it has been conventionally and generally used well known white pigment without any limitation, and suitably mentioned titanium dioxide, zirconium oxide, zinc sulfide, zinc oxide, magnesium oxide, barium sulfate, etc., which may be used two or more kinds in combination. Among the above-mentioned white pigments, titanium dioxide, alumina and magnesium oxide are more preferred, and titanium dioxide is further more preferred. A crystalline form of the titanium dioxide may be any of the rutile type, the anatase type or the brookite type, and the rutile type is preferably used.

An average particle diameter and a shape of the white pigment are not particularly limited, and the average particle diameter is preferably 0.05 to 10.0 µm, more preferably 0.1 to 5.0 µm, further preferably 0.1 to 1.0 µm. Incidentally, the average particle diameter can be obtained as a mass average value $D_{50}$ (or a median diameter) in the particle diameter distribution measurement by the laser beam diffraction method. The white pigment component may be used as a single kind alone or two or more kinds in combination.

A formulation amount of the white pigment is preferably 1 to 300 parts by mass based on 100 parts by mass of the total amount of the thermosetting resin composition, more preferably 3 to 200 parts by mass, particularly preferably 10 to 150 parts by mass. If the formulation amount is 1 part by mass or more, it is preferred since whiteness of the cured product of the resulting thermosetting resin composition is sufficient. If the formulation amount is 300 parts by mass or less, it is preferred since a ratio of an inorganic filler which is to be added for the purpose of lowering a linear expansion coefficient of the metal clad composite laminated substrate of the present invention and improving mechanical strength of the substrate based on the entire filler is not lowered.

The inorganic filler, in this case, represents a filler other than the white pigment, and is added to the thermosetting resin composition for the purpose of lowering a linear expansion coefficient of the metal clad composite laminated substrate of the present invention as well as improving mechanical strength of the substrate. The component of the inorganic filler may be any material so long as it is a conventionally known inorganic filler, and may be mentioned, for example, silica such as fused silica, fused spherical silica, crystalline silica, etc., alumina, silicon nitride, aluminum nitride, boron nitride, antimony trioxide, etc., and fused silica, fused spherical silica and alumina are particularly preferred. The component of the inorganic filler may be used as a single kind alone or two or more kinds in combination.

An average particle diameter and a shape of the inorganic filler component are not particularly limited, and the average particle diameter of the inorganic filler component is generally 0.5 to 50 µm, and in view of moldability and flowability of the resulting silicone resin composition, it is preferably 1 to 10 µm, further preferably 1 to 5 µm. Incidentally, the average particle diameter can be obtained as a mass average value $D_{50}$ (or a median diameter) in the particle diameter distribution measurement by the laser beam diffraction method as mentioned above.

A formulation amount of the inorganic filler component is preferably in the range of 600 parts by mass or less (0 to 600 parts by mass) based on 100 parts by mass of the total amount of the thermosetting resin composition from the viewpoints of a linear expansion coefficient and strength of the resulting metal clad composite laminated substrate, more preferably 10 to 600 parts by mass, further preferably in the range of 50 to 500 parts by mass.

Also, there are materials which can be both of the above-mentioned white pigment and the inorganic filler, i.e., materials which can be used as the white pigment as well as the inorganic filler, which may be specifically mentioned titanium dioxide, alumina, silica, etc.

Into the thermosetting resin composition, conventionally known various kinds of additives may be formulated in addition to the above-mentioned components, if necessary.

Adhesion Additive

To the thermosetting resin composition may be added an adhesion additive (an adhesion imparting agent) to provide adhesion depending on necessity. The adhesion additive may be used as a single kind alone or two or more kinds in combination. The adhesion additive may be mentioned, for example, a linear or cyclic organosiloxane oligomer having 4 to 50 silicon atoms, preferably 4 to 20 silicon atoms containing at least two, preferably two or three kinds of functional groups selected from a hydrogen atom bonded to the silicon atom (SiH group), an alkenyl group bonded to the silicon atom (for example, a Si—CH=CH$_2$ group), an alkoxysilyl group (for example, a trimethoxysilyl group) and an epoxy group (for example, a glycidoxypropyl group, a 3,4-epoxycyclohexylethyl group) in one molecule, an organooxysilyl-modified isocyanurate compound represented by the following general formula (1), its hydrolysis condensate (organosiloxane-modified isocyanurate compound) and a combination of two or more kinds of the above materials, etc.

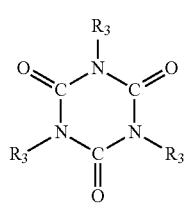
(1)

wherein $R_3$ represents an organic group represented by the following partial structural formula (2), or a monovalent hydrocarbon group containing an aliphatic unsaturated bond, and at least one of $R_3$ is an organic group represented by the partial structural formula (2),

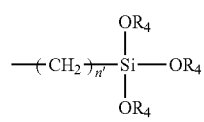
(2)

wherein $R_4$ represents a hydrogen atom or a monovalent hydrocarbon group having 1 to 6 carbon atoms, and "n'" represents an integer of 1 to 6, particularly 1 to 4.

The monovalent hydrocarbon group containing an aliphatic unsaturated bond of $R_3$ in the above-mentioned general formula (1) may be mentioned an alkenyl group having 2 to 8 carbon atoms, particularly 2 to 6 carbon atoms such as a vinyl group, an allyl group, a propenyl group, an isopropenyl group, a butenyl group, an isobutenyl group, a pentenyl group, a hexenyl group, etc., and a cycloalkenyl group having 6 to 8 carbon atoms such as a cyclohexenyl group, etc. Also, the monovalent hydrocarbon group of $R_4$ in the above-mentioned partial structural formula (2) may be mentioned, for example, a monovalent hydrocarbon group having 1 to 8 carbon atoms, in particular, 1 to 6 carbon atoms like an alkyl group such as a methyl group, an ethyl group, a propyl group, an isopropyl group, a butyl group, an isobutyl group, a tert-butyl group, a pentyl group, a hexyl group, etc., a cycloalkyl group such as a cyclohexyl group, etc., an alkenyl group and a cycloalkenyl group exemplified in the above-mentioned $R_3$, further an aryl group such as a phenyl group, etc., and is preferably an alkyl group.

Moreover, the adhesion additive may be exemplified by 1,5-bis(glycidoxypropyl)-1,3,5,7-tetramethylcyclotetrasiloxane, 1-glycidoxypropyl-5-trimethoxysilylethyl-1,3,5,7-tetramethylcyclotetrasiloxane, etc., and a siloxane compound represented by the following formula.

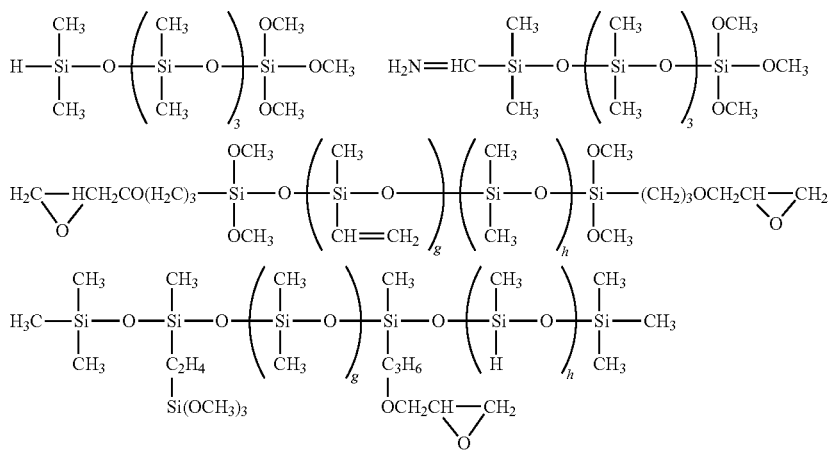

wherein "g" and "h" are integers each within the range of 0 to 50, and are numbers satisfying g+h being 2 to 50, preferably 4 to 20.

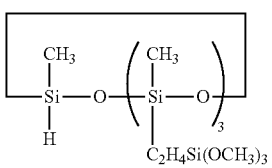

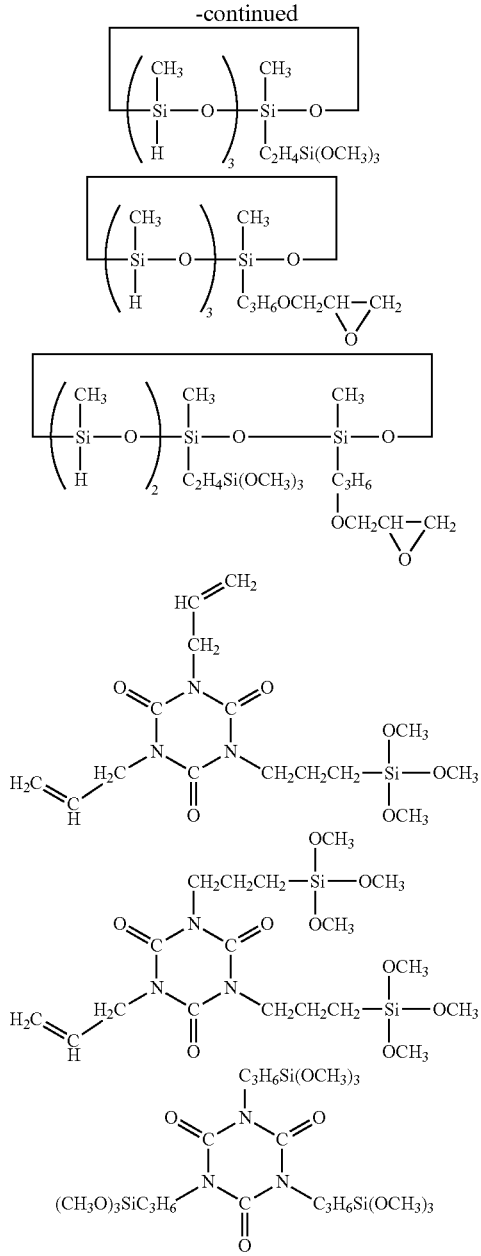

Among the above-mentioned siloxane compounds, the compound which provides particularly good adhesion to the cured product of the resulting thermosetting resin composition is an organosilicon compound having a silicon atom-bonded alkoxy group, and an alkenyl group or a silicon atom-bonded hydrogen atom (a SiH group) in one molecule.

A formulation amount of the adhesion additive is generally 10 parts by mass or less (i.e., 0 to 10 parts by mass) based on 100 parts by mass of the thermosetting resin composition, preferably 0.1 to 8 parts by mass, more preferably about 0.2 to 5 parts by mass. If the formulation amount is 10 parts by mass or less, no bad effect is exerted on the hardness of the cured product of the thermosetting resin composition, and there is no fear of heightening surface tackiness.

Curing Inhibitor

Into the thermosetting resin composition to be used in the present invention, a curing inhibitor may be formulated, if necessary. The curing inhibitor may be used as a single kind alone or two or more kinds in combination. The curing inhibitor may be mentioned, for example, a compound selected from the group consisting of organopolysiloxane highly containing a vinyl group such as tetramethyltetravinylcyclotetrasiloxane, triallylisocyanurate, an alkyl maleate, acetylene alcohols and a silane-modified product and a siloxane-modified product thereof, hydroperoxide, tetramethylethylene diamine, benzotriazole and a mixture thereof, etc. The curing inhibitor may be generally added in an amount of 0.001 to 1.0 parts by mass based on 100 parts by mass of the thermosetting resin composition, preferably 0.005 to 0.5 parts by mass.

A preparation method of the thermosetting resin composition is explained, but the invention is not limited by these.

In general, the composition is stored by dividing two liquids so that curing does not proceed, and curing is carried out by mixing two liquids at the time of use. Of course, it is possible to use as one liquid by adding a little amount of the above-mentioned curing inhibitor. Also, when the silicone resin composition is used as the thermosetting resin composition, an organopolysiloxane, a hydrogen polysiloxane and a catalyst are uniformly mixed to obtain a base composition, and after adding a solvent such as toluene, xylene, heptane, etc., to the base composition, an inorganic filler is further added to the mixture to prepare a solution or a dispersion.

When such a prepreg is prepared, it becomes a prepreg excellent in heat resistance and dimensional stability, and having high surface uniformity and surface homogeneity since a film in which the glass fiber (filament) is surface-treated by a cured product of an organosilicon compound, etc., and bundled is used, and there is neither unfastening nor twisting of the glass fiber after heating under pressure. In addition, the thermosetting resin composition is coated onto the surface-treated glass fiber film and dried to make it in an uncured state, and the prepreg itself has a self-adhesive ability, so that it is not necessary to newly provide an adhesive layer between the metal layer and the insulating layer or between laminated layers of the insulating layer, whereby manufacture of the substrate can be realized by a simple and easy method.

A manufacturing method of the metal clad composite laminated substrate of the present invention is explained, but the present invention is not limited by these.

First, a glass cloth is surface-treated by an organosilicon compound, and the compound is cured by heating to obtain a surface-treated glass fiber film. Next, a thermosetting resin composition is coated onto the surface-treated glass fiber film and dried to obtain an uncured prepreg. Then, a metal foil(s) or a metal plate(s) is/are provided as a metal layer(s) on both surfaces or one surface of a sheet of the prepreg or a plural number of the prepregs being overlapped, and the material is molded under heating and pressure to obtain a metal clad composite laminated substrate. Or else, a sheet of the above-mentioned prepreg or a plural number of the prepregs being overlapped is molded under heating and pressure, and then, metal plating is applied as a metal layer(s) onto both surfaces or one surface thereof to obtain a metal clad composite laminated substrate.

Drying conditions of the above-mentioned prepreg are not particularly limited so long as it is the conditions that the solvent in the thermosetting resin composition is evaporated, and an uncured (A stage) state prepreg can be obtained. At this time, if the thermosetting resin composition is a solid state or a semi-solid state at room temperature, a prepreg in which there is no tackiness at the surface of the prepreg after drying and excellent in workability can be obtained. As the drying conditions, it can be carried out, for example, the surface-treated glass fiber film onto which the thermosetting resin composition has been coated in the state that it is dissolved or dispersed in a solvent is dried preferably at 50 to 150° C., more preferably at 60 to 100° C. Drying may be carried out by optionally using a heating device such as an oven, a dryer, etc.

When metal plating is carried out, it can be done according to the conventional manner and is not particularly limited. There may be mentioned, for example, a method in which a metal coating layer is formed on the fiber film by the electroless plating method. The metal film layer to be formed is preferably selected from Ni, Cu, Fe, Co or an alloy comprising two or more metals mentioned before, for example, a Ni—Cu alloy, a Fe—Ni alloy, a Fe—Co alloy, etc. Also, after the electroless plating, the film may be thickened by electrolytic plating.

As a method of forming a pattern by plating, there may be mentioned, for example, a method in which electroless plating is carried out to the glass fiber to laminate a dry film, then, an optional pattern is formed thereon by exposure and development, further electrolytic plating is carried out to complete the pattern, whereby a metal clad composite laminated substrate on which a pattern has been formed by plating can be obtained.

The metal foil or the metal plate to be used in the present invention may be any material if it is a conventionally known metal foil or metal plate. The metal foil which can be used may be mentioned, for example, a metal foil made of copper, gold, silver, aluminum, nickel, tin, etc., having a thickness of about 5 to 70 μm. Among these, the metal foil is preferably those which have been used as a conductive foil, and a copper foil is generally used, further a foil the surface of which had been subjected to a chemical conversion treatment such as a black oxidization treatment, etc., may be suitably used. The conductive foil preferably used is a foil in which the contacting surface (the surface to be overlapped) with the film has previously been subjected to a chemically or mechanically roughening treatment to heighten the adhesive effect. Specific examples of the conductive foil which has been subjected to the surface roughening treatment may be mentioned a roughened copper foil which has been electrochemically treated when an electrolytic copper foil is manufactured, etc.

The metal plate may be mentioned, for example, a copper plate, an aluminum plate, a ceramic plate, etc. Incidentally, a thickness of the metal plate is not particularly limited. By using the metal plate, it is possible to improve heat dissipation. Also, in the point of improving heat dissipation, a thickness of the surface-treated fiber film is preferably thin. In particular, the fiber film of the present invention has flexibility and high mechanical strength, and insulation can be maintained even when it is a thin film, so that it is useful as a high heat dissipation substrate.

As a method of providing a metal foil or a metal plate onto the surface-treated fiber film, a method generally used may be used without any specific limitation. For example, there may be mentioned a method in which a metal foil or a metal plate is laminated on at least one surface of the surface-treated fiber film. The laminating method may be mentioned a pressing method, a laminating method, etc. Conditions of the pressing method and the laminating method may be optionally selected depending on the characteristics of the surface-treated fiber film. After laminating them, a patterning and a plating process are carried out in accordance with the ordinary method to obtain a metal clad composite laminated substrate.

Curing by heating under molding with heating and pressure may be carried out, for example, by using a hot pressing apparatus, a vacuum pressing apparatus, etc., preferably under a pressure of 1 to 100 MPa, more preferably 5 to 50 MPa, preferably at a temperature of 50 to 200° C., more preferably 70 to 180° C. A curing time may preferably be 1 to 200 minutes, more preferably 2 to 120 minutes. Also, post-cure may be carried out, if necessary.

The metal clad composite laminated substrate of the present invention becomes a substrate excellent in heat resistance and dimensional stability, and having high surface uniformity and surface homogeneity since a film in which the glass fiber (filament) is surface-treated by a cured product of an organosilicon compound, etc., and bundled is used, and there is neither unfastening nor twisting of the glass fiber after heating under pressure. In addition, a prepreg in which the thermosetting resin composition is coated onto the surface-treated glass fiber film and dried is used, and the prepreg itself has a self-adhesive ability, so that it is not necessary to newly provide an adhesive layer between the metal layer and the insulating layer or between laminated layers of the insulating layer, whereby manufacture of the substrate can be realized by a simple and easy method.

The above-mentioned metal clad composite laminated substrate can be made a semiconductor apparatus by, for example, mounting a semiconductor device(s) on the substrate. As mentioned above, the metal clad composite laminated substrate has neither unfastening nor twisting of the glass fiber, so that a substrate having high strength, the glass fiber of which is fixed, excellent in heat resistance, discoloration resistance and dimensional stability, and also having high surface uniformity and surface homogeneity can be obtained. Thus, it can be applied to a semiconductor apparatus which is required to have high heat resistance to which a lead-free solder, etc., is applied, or a high performance semiconductor apparatus. The insulating layer itself has a self-adhesive ability, so that it is not necessary to newly provide an adhesive layer between the metal layer and the insulating layer or between laminated layers of the insulating layer, whereby the manufacturing process of the semiconductor apparatus can be made more simple and easier.

Also, the substrate of the present invention can be made a white fiber substrate containing a white pigment for the purpose of heightening light reflectance. According to this constitution, it can be suitably applied to the devices which are required to have light reflectance of the white fiber substrate to be 80% or more (i.e., 80 to 100%) over the entire visible light region.

Incidentally, the white pigment may be formulated in at least one of the surface-treated fiber film and the prepreg mentioned later. In the white fiber substrate of the present invention, when the constitution that does not use the prepreg mentioned later, or the constitution that does not formulate the white pigment in the prepreg mentioned later, the white pigment is formulated in the surface-treated fiber film.

The white fiber substrate of the present invention may be any substrate so long as it contains a fiber film base material comprising a sheet of the above-mentioned surface-treated fiber film or a plural number of the films being laminated, and a prepreg base material comprising one or more sheets of the prepreg mentioned below is/are laminated may be superimposed with the fiber film base material.

As the prepreg which becomes one of the materials of the white fiber substrate according to the present invention, a prepreg in which the thermosetting resin composition is impregnated into the base material and dried which is in an uncured state is suitable.

As the base material which constitutes the prepreg, there may be mentioned woven fabric or unwoven fabric using fiber including inorganic fiber such as glass fiber, carbon fiber, ceramic fiber, etc.; metal fiber such as boron fiber, steel fiber, tungsten fiber, etc.; and novel heat resistant fiber such as aramid fiber, phenol fiber, etc., preferably woven fabric of glass fiber (glass cloth), etc., is used, and particularly preferably a glass cloth is used.

Also, the thermosetting resin composition which constitutes the prepreg is not particularly limited, and may be mentioned a composition such as a BT resin, an epoxy resin, a silicone resin, a hybrid resin comprising an epoxy resin and a silicone resin, a cyanate ester resin, etc. Among these, a thermosetting silicone resin composition is preferred since it is excellent in adhesion with the above-mentioned surface-treated fiber film, and also excellent in heat resistance, etc.

As the thermosetting silicone resin composition which can be used in this embodiment, in particular, a material comprising the following mentioned Components (A') to (D') may be exemplified, and such a material is used, it is a solid or semi-solid at room temperature (15 to 30° C.) even when it is in an uncured state, so that its handling is easy whereby it is further preferred.

(A') an organopolysiloxane with a resin structure comprising an $R^5SiO_{1.5}$ unit, an $R^6{}_2SiO$ unit and an $R^7{}_aR^8{}_bSiO_{(4-a'-b')/2}$ unit, and contains a structure in which at least a part of the above-mentioned $R^6{}_2SiO$ unit is comprised continuously and repeatedly, and the number of repeating units is 5 to 50, wherein each $R^5$, $R^6$ and $R^7$ independently represents a hydroxyl group, a methyl group, an ethyl group, a propyl group, a cyclohexyl group or a phenyl group, each $R^8$ independently represents a vinyl group or an allyl group, "a'" represents 0, 1 or 2, "b'" represents 1 or 2, and a'+b' represents 2 or 3, (B') an organohydrogen polysiloxane having a resin structure which comprises an $R^5SiO_{1.5}$ unit, an $R^6{}_2SiO$ unit and an $R^7{}_cH_{d'}SiO_{4-c'-d'/2}$ unit, and contains a structure in which at least a part of the above-mentioned $R^6{}_2SiO$ unit is comprised continuously and repeatedly, and the number of repeating units is 5 to 50: an amount of a hydrogen atom bonded to the silicon atom in Component (B') based on the total amount of a vinyl group and an allyl group in Component (A') is 0.1 to 4.0 in a molar ratio, wherein each $R^5$, $R^6$ and $R^7$ independently represent as defined above, "c'" represents 0, 1 or 2, "d'" represents 1 or 2, and c'+d' represents 2 or 3, (C') a platinum group metallic catalyst: an effective amount, and (D') a filler: 900 parts by mass or less based on 100 parts by mass of Components (A') and (B') in total.

As the platinum group metallic catalyst among these, there may be mentioned, for example, chloroplatinic acid, alcohol-modified chloroplatinic acid, a platinum complex having a chelate structure, etc. These may be used a single kind alone or two or more kinds in combination.

Also, the filler is preferably an inorganic filler, and specifically mentioned silica such as fused silica, crystalline silica, etc., alumina, silicon nitride, aluminum nitride, aluminosilicate, boron nitride, antimony trioxide, etc. An average particle diameter and a shape of these inorganic fillers are not particularly limited.

Further, in the above-mentioned thermosetting resin composition, a white pigment may be formulated as a filler. Such a white pigment may be exemplified by the same materials as those formulated in the above-mentioned surface-treated fiber film.

A formulation amount of the white pigment is preferably 1 to 300 parts by mass based on 100 parts by mass in total of the formulation amount of the thermosetting resin to be used for preparing the prepreg, more preferably 3 to 200 parts by mass, particularly preferably 10 to 150 parts by mass. If the formulation amount is 1 part by mass or more, whiteness of the resulting prepreg is sufficient so that it is preferred. If the formulation amount is 300 parts by mass or less, a linear expansion coefficient of the white fiber substrate of the present invention is lowered, and a ratio of the inorganic filler to be used for the purpose of improving mechanical strength of the substrate occupied in the entire filler does not become low so that it is preferred.

In the prepreg of the present invention, the thermosetting resin composition as mentioned above is impregnated into the base material in the state that it is dissolved or dispersed in a solvent, and then, the resulting base material is dried so that the above-mentioned solvent is evaporated and removed away therefrom.

The white fiber substrate of the present invention contains the above-mentioned fiber film base material, or a material in which the fiber film base material and the above-mentioned prepreg base material are superimposed. The white fiber substrate may be prepared by the methods that the surface-treated fiber films alone (the fiber film base materials alone) are laminated; a sheet of the surface-treated fiber film (the fiber film base material) and a sheet of the prepreg (a prepreg base material) are alternately superimposed; or each one or more layers of a material(s) in which two or more surface-treated fiber films has been laminated (a fiber film base material) and a material(s) in which two or more prepregs has been laminated (a prepreg base material) are laminated, or the like. Also, an adhesive layer may be provided between the fiber film base materials with each other, or between the fiber film base material and the prepreg base material to improve adhesion, or a function as an adhesive layer may be provided to the prepreg base material itself. For example, as a heat fusion method for mediating an adhesive layer or a prepreg at the surface between two sheets of the surface-treated fiber films, any conventionally known method can be employed so long as it is carried out by heating and pressure, which is not particularly limited, and there may be suitably employed a method such as a hot pressing method, a heat laminate roll method, and a method combining these methods.

The adhesive layer is preferably a material which has low discoloration to heat or light, and may be mentioned, for example, the above-mentioned prepreg and a silicone type adhesive agent, etc.

The white fiber substrate manufactured by the method as mentioned above can be made a substrate excellent in bendability (flexibility). More specifically, when the white fiber substrate is bent along with the housing having a radius of 75 mm as shown in FIG. 1, it is desired that it can be bent preferably 90° or more, more preferably 120° or more and 180° or lower, further preferably 150° or more and 180° or lower.

In the white fiber substrate, heat resistance, dimensional stability, light resistance, weather resistance, etc., of the surface-treated fiber film (fiber film base material) used for preparing the same are excellent, and the substrate has a self-standing property and there is neither twisting nor unfastening of the fiber, so that it becomes a substrate excellent in heat resistance, electric insulation, heat conductivity, discoloration resistance, dimensional stability, impact resistance and flexibility. Such a white fiber substrate contains a white pigment in the fiber film base material and/or the prepreg base material, so that it has high reflectance, and due to good characteristics of the fiber film base material, it can be made a substrate having a low average linear expansion coefficient, high storage rigidity at high temperatures, excellent in surface uniformity, and easy in miniaturization.

Such a white fiber substrate is excellent in characteristics such as heat resistance, discoloration resistance, dimensional stability, impact resistance, etc., and further has high reflectance, bendability and flexibility, so that it can be suitably used as a material for a semiconductor apparatus which is required to be high density mounting, miniaturization and high performance, in particular, a material for a semiconductor apparatus which is required to have high reflectance. Also, the white fiber substrate can be used in various kinds of fields including a highly reflective film and substrate for a display such as a television, a tablet, a smartphone, etc., a highly reflective film and substrate for a solar cell, and the like, due to the above-mentioned characteristics.

EXAMPLES

In the following, the present invention is explained more specifically by referring to Production Examples, Comparative Production Examples, Synthesis Examples, Examples and Comparative Examples, but the present invention is not limited by the Examples mentioned below.

I. Evaluation of Metal Clad Surface-Treated Fiber Substrate

Production Example 1

Methyltrimethoxysilane (Product name: KBM-13 available from Shin-Etsu Chemical Co., Ltd.) was used as an organosilicon compound, impregnated into a glass cloth (Used yarn: E250, density: 59 warp yarns/25 mm, 57 weft yarns/25 mm, thickness: 87 μm, mass: 95 g/m$^2$), and dried under heating at 100° C. for 10 minutes. Thereafter, the material was subjected to a heat treatment at 100° C.×1 hour and at 200° C.×1 hour to prepare a surface-treated fiber film (A1). The obtained surface-treated fiber film was subjected to the following measurements.

1. Appearance

Uniformity of the surface of the obtained surface-treated fiber film, i.e., whether the surface is smooth and whether a crack is present or not on the surface were confirmed by naked eyes.

2. Conventional Flexural Rigidity

The conventional flexural rigidity of the obtained surface-treated fiber film was measured by the method described in JIS R 3420, and a ratio of the conventional flexural rigidity was calculated from the equation mentioned below.

Ratio of conventional flexural rigidity=Conventional flexural rigidity of the surface-treated fiber film/Conventional flexural rigidity of the untreated fiber film.

Also, from the obtained surface-treated fiber film, a rectangular test piece having a width of 25 mm, a length of 250 mm was cut from the fiber to be tested with each 6 pieces in the warp direction, and the following measurements were carried out.

3. Linear Expansion Coefficient

A sample having a width of 3 mm, a length of 25 mm and a thickness of 50 to 300 mm was cut from the obtained surface-treated fiber film, and the sample was subjected to the tensile test using a thermomechanical analysis (TMA) apparatus (Name of apparatus: TMA/SS6000, manufactured by Seiko Instruments Inc.) in the temperature range of from −60° C. to 200° C. with a temperature raising rate of 5° C./min while applying a load of 100 mN. A thermal expansion coefficient was calculated from an elongation amount of the surface-treated fiber film relative to the temperature.

4. Flexibility Test of Film

The obtained surface-treated fiber film was fitted into a peripheral part of a semicylindrical shaped housing 2 having a width of 100 mm and a radius of 75 mm as shown in FIG. 1, and crack and collapse of the film 1 were observed.

These respective measurement results are shown in Table 1.

Production Example 2

To 100 parts by mass of water were added 10 parts by mass of 3-glycidoxypropyltrimethoxysilane (Product name: KBM-403 available from Shin-Etsu Chemical Co., Ltd.) as an organosilicon compound, 0.02 part by mass of a surfactant and 0.05 part by mass of acetic acid to prepare a coating solution. By using the coating solution, a surface-treated fiber film (A2) was obtained in the same manner as in Production Example 1. By using the obtained surface-treated fiber film, appearance, mechanical characteristics and a linear expansion coefficient were evaluated in the same manner as in Production Example 1.

Production Example 3

To 50 g of toluene was added 50 g of an epoxy group-containing oligomer (Product name: X-41-1059A available from Shin-Etsu Chemical Co., Ltd.) to prepare a coating solution. To the coating solution was added 10 g of titanium oxide (Product name: PF-691, average particle diameter: about 0.2 μm available from Ishihara Sangyo Kaisha Ltd.) to prepare a toluene dispersion. By using the dispersion and a glass cloth (Used yarn: D450, density: 53 warp yarns/25 mm, 53 weft yarns/25 mm, thickness: 42 μm, mass: 47 g/m$^2$), a surface-treated fiber film (A3) was obtained in the same manner as in Production Example 1. By using the obtained glass fiber film, appearance, mechanical characteristics and a linear expansion coefficient were evaluated in the same manner as in Production Example 1.

Production Example 4

To 100 g of an addition curing type resin in which an unsaturated group-containing organopolysiloxane containing an $R^1SiO_{1.5}$ unit and a hydrosilyl group-containing organopolysiloxane had been formulated so that H/Vi is 1.1 was added octyl alcohol solution of 1% by mass of chloroplatinic acid so that the platinum became 10 ppm, and 100 g of toluene was added to the mixture to prepare a coating solution. By using the coating solution, a thermally cured glass fiber film (A4) was obtained in the same manner as in Production Example 1. By using the obtained glass fiber film, appearance, mechanical characteristics and a linear expansion coefficient were evaluated in the same manner as in Production Example 1.

Comparative Production Example 1

To 95 g of toluene was added 5 g of 3-glycidoxypropyltrimethoxysilane (Product name: KBM-403 available from Shin-Etsu Chemical Co., Ltd.) to prepare a coating solution. By using the coating solution, a surface-treated fiber film (B1) was obtained in the same manner as in Production Example 1. By using the obtained glass fiber film, appearance, mechanical characteristics and a linear expansion coefficient were evaluated in the same manner as in Production Example 1.

Comparative Production Example 2

3-Glycidoxypropyltrimethoxysilane (Product name: KBM-403 available from Shin-Etsu Chemical Co., Ltd.) was charged into a mold having a size of 200 mm×240 mm×3 mm and treated with Teflon (Registered Trademark), a glass cloth (Used yarn: E250, density: 59 warp yarns/25 mm, 57 weft yarns/25 mm, thickness: 87 μm, mass: 95 g/m$^2$) was immersed therein, and then, the glass cloth was dried under heating at 100° C. for 10 minutes to obtain a surface-treated fiber film (B2). An attached amount of the organo-silicon compound was 92% by mass, but large cracks were generated at the surface-treated fiber film and the subsequent measurement could not be done.

Comparative Production Example 3

By using the glass cloth (Used yarn: D450, density: 53 warp yarns/25 mm, 53 weft yarns/25 mm, thickness: 42 μm, mass: 47 g/m$^2$) (B3) which had not been surface-treated, appearance, mechanical characteristics and a linear expansion coefficient were evaluated in the same manner as in Production Example 1.

Example 1

A sheet of the surface-treated fiber film (A1) obtained in Production Example 1 was provided and molded under pressure by a hot pressing apparatus at 150° C. for 30 minutes, and the material was further secondary cured at 150° C. for one hour to obtain a surface-treated fiber substrate (C1-1). Similarly, copper foils (available from Fukuda Metal Foil & Powder Co., Ltd., thickness: 18 μm) were provided onto both sides of a sheet of the surface-treated fiber film (A1), an adhesive layer made of a silicone resin (Product name: KE-109, available from Shin-Etsu Chemical Co., Ltd.) was coated between the surface-treated fiber film and the copper foil, then, the material was molded under pressure by a hot pressing apparatus at 150° C. for 30 minutes, and further secondary cured at 150° C. for one hour to obtain a copper clad surface-treated fiber substrate (C1-2).

5. Appearance

The surface of the obtained surface-treated fiber substrate was observed by naked eyes to confirm the presence or absence of unfastening and twisting of the fiber.

6. Heat Resistance

The obtained surface-treated fiber substrate was subjected to an IR reflow treatment at 260° C. for 60 seconds using the above-mentioned IR reflow apparatus, and then, change in a color at the surface thereof was observed by naked eyes.

7. Warpage After IR Reflow Test

Figure 2:
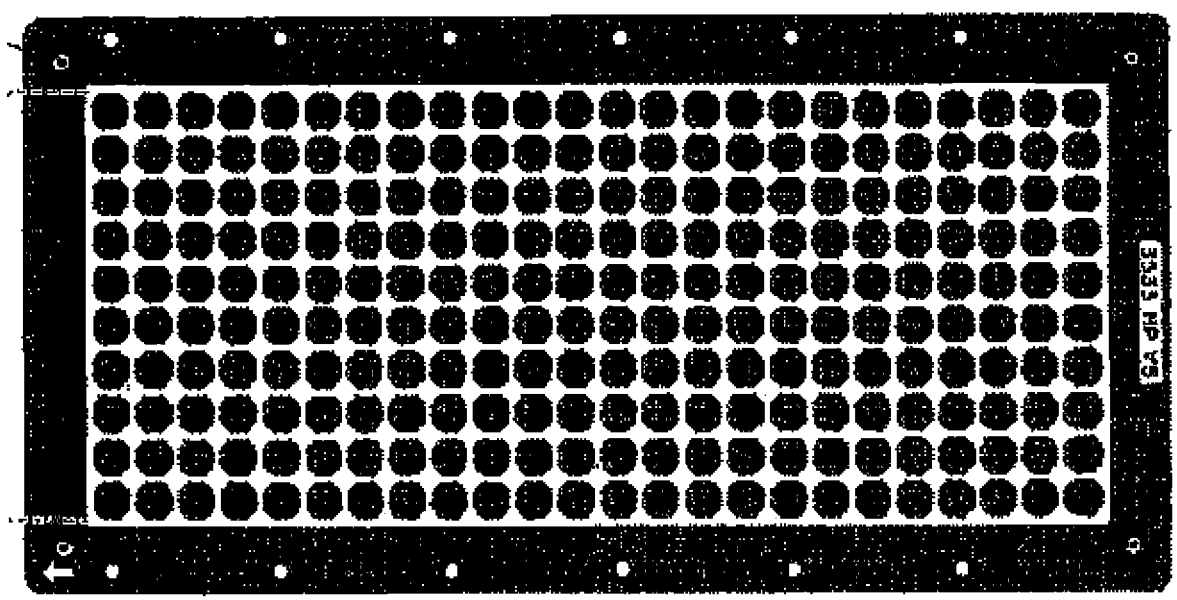
FIG. 2 is a top view of a substrate when warpage after the IR reflow test is to be measured in Examples and Comparative Examples.

A substrate (a length: 50 mm and a width: 100 mm) having a shape as shown in FIG. 2 was prepared by using the obtained copper clad surface-treated fiber substrate. With regard to the prepared substrate, after subjecting to an IR reflow treatment at 260° C. for 60 seconds by using an IR reflow apparatus (Name of apparatus: TNR15-225LH,

TABLE 1

|  | Production Example 1 | Production Example 2 | Production Example 3 | Production Example 4 | Comparative Production Example 1 | Comparative Production Example 2 | Comparative Production Example 3 |
|---|---|---|---|---|---|---|---|
| Surface treated fiber film | A1 | A2 | A3 | A4 | B1 | B2 | B3 |
| Attached amount (% by mass) | 5.6 | 4.5 | 56.5 | 40.2 | 0.2 | 92.0 | 0 |
| Appearance | Good | Good | Good | Good | Good | Crack | Good |
| Ratio of conventional flexural rigidity | 4.4 | 6.3 | 29.5 | 20.4 | 1.3 | Unable to measure (>100) | 1 |
| Linear expansion co-efficient (ppm/° C.) | 7 | 8 | 13 | 17 | 6 | Unable to measure | Unable to measure |
| Flexibility of film*1 | Good | Good | Good | Good | Good | Poor | Good |

*1Film flexibility
Good: Neither crack nor peeling
Poor: Crack or peeling present As shown in Table 1, when the glass fiber was not treated or the attached amount is too little, a ratio of the conventional flexural rigidity became low, and the film did not have the self-standing property and the fiber was not fixed. On the other hand, if the attached amount is too much, crack was generated at the surface thereof. In the present invention, Production Examples 1 to 4 which were good surface-treated fiber films in which a ratio of the conventional flexural rigidity became 3 to 100-fold could be obtained by adjusting the attached amount. By using Production Examples 1 to 4, a metal clad surface-treated fiber substrate was each molded by the method described below, and evaluation thereof was carried out.

manufactured by TAMURA Corporation), warpage (unit: mm) of the substrate in the longitudinal direction was measured.

These respective measurement results are shown in Table 2.

Example 2

A surface-treated fiber substrate (C2-1) and a copper clad surface-treated fiber substrate (C2-2) were obtained in the same manner as in Example 1 using a sheet of the surface-treated fiber film (A2) obtained in Production Example 2. By using the obtained surface-treated fiber substrate and the copper clad surface-treated fiber substrate, appearance, an IR reflow test and heat resistance were evaluated in the same manner as in Example 1.

Example 3

A sheet of the surface-treated fiber film (A3) obtained in Production Example 3 was provided and molded under pressure by a hot pressing apparatus at 150° C. for 30 minutes, and the material was further secondary cured at 150° C. for one hour to obtain a surface-treated fiber substrate (C3-1). Similarly, copper foils (available from Fukuda Metal Foil & Powder Co., Ltd., thickness: 18 μm) were provided onto both sides of a sheet of the surface-treated fiber film (A3), and the material was molded under pressure by a hot pressing apparatus at 150° C. for 30 minutes, and further secondary cured at 150° C. for one hour to obtain a copper clad surface-treated fiber substrate (C3-2). By using the obtained surface-treated fiber substrate and the copper clad surface-treated fiber substrate, appearance, an IR reflow test and heat resistance were evaluated in the same manner as in Example 1.

Example 4

A surface-treated substrate (C4-1) and a copper clad surface-treated fiber substrate (C4-2) were obtained in the same manner as in Example 3 using two sheets of the surface-treated fiber films (A3) obtained in Production Example 3. By using the obtained surface-treated fiber substrate and the copper clad surface-treated fiber substrate, appearance, an IR reflow test and heat resistance were evaluated in the same manner as in Example 1.

Example 5

A surface-treated fiber substrate (C5-1) and a copper clad surface-treated fiber substrate (C5-2) were obtained in the same manner as in Example 3 using a sheet of the surface-treated fiber film (A4) obtained in Production Example 4. By using the obtained surface-treated fiber substrate and the copper clad surface-treated fiber substrate, appearance, an IR reflow test and heat resistance were evaluated in the same manner as in Example 1.

Comparative Example 1

Using 180 g of a commercially available addition reaction curing type silicone varnish (Product name: KJR-632 available from Shin-Etsu Chemical Co., Ltd.), 200 g of toluene was added thereto as a solvent, and further, 189 g of silica (Product name: Admafine E5/24C, average particle diameter: about 3 μm, available from Admatechs Co., Ltd.) was added to obtain a toluene dispersion. Into the toluene dispersion was immersed the glass fiber (B1) obtained in Comparative Production Example 1, and the material was dried at 100° C. for 10 minutes to obtain a silicone resin prepreg in the uncured state. A silicone resin substrate (D1-1) and a copper clad silicone resin substrate (D1-2) were obtained in the same manner as in Example 3 by using four sheets of the obtained uncured silicone resin prepregs. By using the obtained silicone resin substrate and the copper clad silicon resin substrate, appearance, an IR reflow test and heat resistance were evaluated in the same manner as in Example 1.

Comparative Example 2

Using the glass fiber (B3) which had not been treated by an organosilicon compound, it was impregnated with a slurry liquid of an epoxy resin composition comprising 10 parts by mass of a cresol novolak epoxy resin (Product name: EPICRON N-695, available from DIC Corporation), 5 parts by mass of a phenol novolak resin (Product name: PHENOLITE TD-2090, available from DIC Corporation), 0.1 parts by mass of an imidazole catalyst (Product name: 2E4MZ, available from Shikoku Chemicals Corporation), 85 parts by mass of spherical silica (Product name: SC-2050-SE, available from Admatechs Co., Ltd.) and 50 parts by mass of an MEK solvent, and the material was dried at 100° C. for 10 minutes to obtain an epoxy resin-impregnated glass cloth in the uncured state. A glass epoxy substrate (D2-1) and a copper clad glass epoxy substrate (D2-2) were obtained in the same manner as in Example 3 by using four sheets of the obtained uncured epoxy resin-impregnated glass clothes. By using the obtained glass epoxy substrate and the copper clad glass epoxy substrate, appearance, an IR reflow test and heat resistance were evaluated in the same manner as in Example 1.

TABLE 2

|  | Example 1 | Example 2 | Example 3 | Example 4 | Example 5 | Comparative Example 1 | Comparative Example 2 |
| --- | --- | --- | --- | --- | --- | --- | --- |
| Fiber film | A1 | A2 | A3 | A3 | A4 | B1 | Uncured epoxy resin prepreg |
| Appearance | Good | Good | Good | Good | Good | Unfastening and twisting generated | Unfastening and twisting generated |
| Heat resistance | No discoloration | No discoloration | No discoloration | No discoloration | No discoloration | No discoloration | Discoloration present |
| Warpage after IR reflow test (mm) | 1 | 1 | 1 | 2 | 2 | 9 | 1 |

As shown in Table 2, by using good surface-treated fiber films, a substrate without unfastening or twisting of the fiber can be obtained. Therefore, it could be clarified that due to inner shear stress, generation of twisting or warpage of the substrate itself was suppressed, and good results could be also obtained in the IR reflow test. In addition, it was a surface-treated fiber film treated by the organosilicon compound, it could be understood that it had high discoloration resistance.

From the results mentioned above, it is clarified the metal clad surface-treated fiber substrate of the present invention has a uniform and homogeneous insulating layer which does neither generate unfastening nor twisting of the glass fiber when it is made a substrate, and is a substrate excellent in heat resistance, discoloration resistance, dimensional stability. Thus, it can be expected to be suitably used as a substrate for a semiconductor apparatus in the field requiring high heat resistance to which a high melting point lead-free solder is applied, or in which a high performance device is used.
II. Evaluation of White Fiber Substrate
[Production of Surface-Treated Fiber Film]

Production Example 5

100 parts of methyltrimethoxysilane (Product name: KBM-13, available from Shin-Etsu Chemical Co., Ltd.) as an organosilicon compound and 30 parts of rutile type titanium oxide (TIPAQUE CR-95 available from Ishihara Sangyo Kaisha Ltd., average particle diameter: 0.28 μm) as a white pigment were used and impregnated into a glass cloth (Used yarn: E250, density: 59 warp yarns/25 mm, 57 weft yarns/25 mm, thickness: 87 μm, mass: 95 g/m$^2$), and the material was dried under heating at 100° C. for 10 minutes. Thereafter, the material was subjected to heat treatment at 100° C. for 1 hour and 200° C. for 1 hour to prepare a white-colored surface-treated fiber film. An attached amount of the organosilicon compound is shown in Table 3.

Also, with regard to the prepared surface-treated fiber film, the following measurements were carried out. The results are shown in Table 3.
Mechanical Characteristics
With regard to the obtained surface-treated fiber film, the following mechanical characteristics were measured.
Conventional Flexural Rigidity
Measurement was carried out by the method described in JIS R 3420 (glass fiber general testing method), and the measured value in the warp direction was used. The results are shown in Table 3.
Optical Characteristics
The following light reflectance of the obtained surface-treated fiber film was measured.
Light Reflectance
Light reflectance of the surface-treated fiber film was measured in the range of 400 to 800 nm using X-rite 8200 manufactured by STG Corp., and a reflectance at 450 nm was confirmed.

Production Example 6

A white-colored surface-treated fiber film was prepared in the same manner as in Production Example 5 except for using γ-glycidoxypropyltrimethoxysilane (Product name: KBM-403, available from Shin-Etsu Chemical Co., Ltd.) as the organosilicon compound, and the same evaluation as in Production Example 5 was carried out. The results are shown in Table 3.

Production Example 7

A white-colored surface-treated fiber film was prepared in the same manner as in Production Example 5 except for using 3-aminopropyltrimethoxysilane (Product name: KBM-903, available from Shin-Etsu Chemical Co., Ltd.) as the organosilicon compound, and the same evaluation as in Production Example 5 was carried out. The results are shown in Table 3.

Production Example 8

Using methyltrimethoxysilane (Product name: KBM-13, available from Shin-Etsu Chemical Co., Ltd.) as the organosilicon compound, it was impregnated into a glass cloth (Used yarn: E250, density: 59 warp yarns/25 mm, 57 weft yarns/25 mm, thickness: 87 μm, mass: 95 g/m$^2$), and dried under heating at 100° C. for 10 minutes. Thereafter, heat treatment was carried out at 100° C. for 1 hour and at 200° C. for 1 hour to prepare a milky white semi-transparent surface-treated fiber film.

Production Example 9

A white-colored surface-treated fiber film was prepared in the same manner as in Production Example 5 except for using a toluene solution prepared by adding 10 parts of γ-glycidoxypropyltrimethoxysilane (Product name: KBM-403, available from Shin-Etsu Chemical Co., Ltd.) as the organosilicon compound to 90 parts of toluene, and the same evaluation as in Production Example 5 was carried out. The results are shown in Table 3.

Production Example 10

Using γ-glycidoxypropyltrimethoxysilane (Product name: KBM-403, available from Shin-Etsu Chemical Co., Ltd.) as the organosilicon compound and 30 parts of rutile type titanium oxide (TIPAQUE CR-95 available from Ishihara Sangyo Kaisha Ltd., average particle diameter: 0.28 μm) as the white pigment, the mixture was impregnated into a glass cloth (Used yarn: E250, density: 59 warp yarns/25 mm, 57 weft yarns/25 mm, thickness: 87 μm, mass: 95 g/m$^2$), and dried under heating at 100° C. for 10 minutes. This operation was repeated fourth times, and then, the material was subjected to heat treatments at 100° C. for 1 hour and at 200° C. for 1 hour to prepare a surface-treated white fiber film.

Comparative Production Example 4

A thermoplastic resin composition obtained by mixing 60 parts by mass of a polyether ether ketone resin, PEEK450G (available from VICTREX plc.) and 40 parts by mass of a noncrystalline polyether imide resin, Ultem 1000 (available from GE Co.), with 30 parts by mass of rutile type titanium oxide (TIPAQUE CR-95 available from Ishihara Sangyo Kaisha Ltd., average particle diameter: 0.28 μm) as the white pigment and 21 parts by mass of synthetic mica (average particle diameter: 5 μm, average aspect ratio: 50) was melted and kneaded, and subjected to extrusion molding using an extruder equipped with a T-die at a setting temperature of 380° C., to prepare a white-colored film with a thickness of 100 μm.

Comparative Production Example 5

To 60 parts by mass of tricyclodecanedimethanol diacrylate (NK ester A-DCP, available from Shin-Nakamura Chemical Co., Ltd.) were added 40 parts by mass of titanium oxide (TIPAQUE CR-90-2 available from Ishihara Sangyo Kaisha Ltd., average particle diameter: 0.25 μm) and 1 part by mass of Irgacure 907 (2-methyl-1-[4-(methylthio)phenyl]-2-morpholinopropane-1-one) available from BASF Japan as a photopolymerization initiator to prepare a solution. To the solution was impregnated a glass cloth (Used yarn: E250, density: 59 warp yarns/25 mm, 57 weft yarns/25 mm, thickness: 87 μm, mass: 95 g/m$^2$), allowed to stand for 10 minutes, and a PET film with a thickness of 100 μm was superimposed on the impregnated glass cloth and the thickness of the resulting material was made uniform using a laminator.

To the both sides of the PET film side and the glass side was irradiated an UV beam with 2000 mJ/cm² by a high-pressure mercury lamp to obtain a curable composition. Further, the sheet was peeled off from the PET film, and heated at 230° C. for 30 minutes to prepare a white-colored fiber film with a thickness of 100 μm.

Comparative Production Example 6

Using γ-glycidoxypropyltrimethoxysilane (Product name: KBM-403, available from Shin-Etsu Chemical Co., Ltd.) as the organosilicon compound and 10 parts of rutile type titanium oxide (TIPAQUE CR-95 available from Ishihara Sangyo Kaisha Ltd., average particle diameter: 0.28 μm) as the white pigment, the mixture was impregnated into a glass cloth (Used yarn: E250, density: 59 warp yarns/25 mm, 57 weft yarns/25 mm, thickness: 87 μm, mass: 95 g/m²), and the material was dried under heating at 100° C. for 10 minutes. The material was subjected to heat treatments at 100° C. for 1 hour and at 200° C. for 1 hour to prepare a surface-treated white fiber film.

TABLE 3

|  | Ratio of conventional flexural rigidity | Light reflectance (% at 450 nm) | Attached amount (% by mass) |
|---|---|---|---|
| Production Example 5 | 38.2 | 82 | 28.5 |
| Production Example 6 | 40.3 | 80 | 26.2 |
| Production Example 7 | 29.8 | 81 | 25.3 |
| Production Example 8 | 18.5 | — | 15.6 |
| Production Example 9 | 3.8 | 80 | 5.3 |
| Production Example 10 | 95.1 | 95 | 58.9 |
| Comparative Production Example 4 | — | 80 | 26.3 |
| Comparative Production Example 5 | 126 | 78 | 28.9 |
| Comparative Production Example 6 | 1.6 | 36 | 1.3 |

From the results shown in Table 3, it could be understood that the fiber films produced in Production Examples 5 to 10 each had a ratio of the conventional flexural rigidity within the range of 3-fold to 100-fold. To the contrary, no fiber was used in Comparative Production Example 4 so that the ratio of the conventional flexural rigidity could not be measured, and the fiber films manufactured in Comparative Production Examples 5 and 6 were found that the ratios of the conventional flexural rigidity were out of the range.

[Preparation of Prepreg]
—Vinyl Group-Containing Organopolysiloxane Resin (a1)—

In a toluene solvent were dissolved 1142.1 g of an organosilane represented by PhSiCl₃ (87.1 mole %), 529 g of ClMe₂SiO(Me₂SiO)₃₃SiMe₂Cl (3.2 mole %) and 84.6 g of MeViSiCl₂ (9.7 mole %), and the solution was added dropwise into water to co-hydrolyze, followed by washing, neutralization by alkali washing and dehydration, and then, the solvent was stripped to synthesize a vinyl group-containing resin (a1). The resin was a solid having a weight average molecular weight of 62,000, and a melting point of 60° C. The vinyl group content of the product is 0.05 mole/100 g.

—Hydrosilyl Group-Containing Organopolysiloxane Resin (b1)—

In a toluene solvent were dissolved 1142.1 g of an organosilane represented by PhSiCl₃ (87.1 mole %), 529 g of ClMe₂SiO(Me₂SiO)₃₃SiMe₂Cl (3.2 mole %) and 69 g of MeHSiCl₂ (9.7 mole %), and the solution was added dropwise into water to co-hydrolyze, followed by washing, neutralization by alkali washing and dehydration, and then, the solvent was stripped to synthesize a hydrosilyl group-containing resin (b1). The resin was a solid having a weight average molecular weight of 58,000, and a melting point of 58° C. The hydrosilyl group content of the product is 0.05 mole/100 g.

189 g of the vinyl group-containing resin (a1) obtained as mentioned above, 189 g of the hydrosilyl group-containing resin (b1) obtained as mentioned above, 0.2 g of an acetylene alcohol series ethynylcyclohexanol as a reaction inhibitor, and 0.1 g of octyl alcohol solution containing 1% by mass of chloroplatinic acid were charged in an apparatus, and the mixture was well mixed with a planetary mixer heated to 60° C. to obtain a base composition. To the base composition were added 6 g of the adhesion additive represented by the following formula and 400 g of toluene as a solvent, and then, 473 g of alumina (Product name: Admafine AO-502, average particle diameter: about 0.6 μm, available from Admatechs Co., Ltd.) and 47 g of titanium oxide (Product name: PF-691, average particle diameter: about 0.2 μm, available from Ishihara Sangyo Kaisha Ltd.) were further added to the mixture to prepare a toluene dispersion of the silicone resin composition.

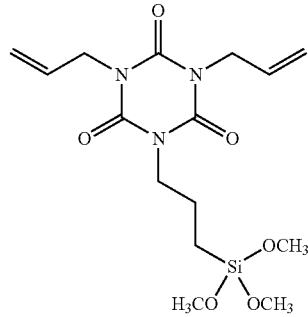

Adhesion additive

The toluene dispersion was impregnated into a quartz glass cloth (available from Shin-Etsu Quartz Products Co., Ltd., thickness: 100 μm), and then, toluene was evaporated in a hot air dryer at 110° C. for 10 minutes to obtain a prepreg of the quartz glass cloth.

[Preparation of White Fiber Substrate]

Example 6

Two sheets of the prepregs obtained as mentioned above were put between each of three sheets of the surface-treated white fiber films obtained in Production Example 5 as adhesive layers, i.e., alternately superimposed so that the films became the outermost layers, and the resulting material was pressed at a temperature of 200° C. and a pressure of 2 MPa for a pressing time of 70 minutes to prepare a white fiber substrate. By using the prepared white fiber substrate, evaluations of the optical characteristics and mechanical characteristics mentioned below were carried out. The results are shown in Table 4.

Optical Characteristics

The following light reflectance of the obtained white fiber substrate was measured.

Light Reflectance

Light reflectance of the white fiber substrate was measured in the range of 400 to 800 nm using X-rite 8200 manufactured by STG Co., and a reflectance at 450 nm was confirmed.

Heat Resistant Characteristics

Heat resistance test was carried out at 150° C. for 1000 hrs using the substrate after measurement of the light reflectance, and a reflectance thereof was measured in the same manner as in the measurement of the light reflectance and the reflectance at 450 nm was confirmed.

Mechanical Characteristics

Dimensional Stability

Presence or absence of twisting and unfastening of the warp and weft yarn at the time of press molding was confirmed.

Flexibility Test

The white fiber substrate was fitted into a peripheral part of a semicylindrical shaped housing 2 having a width of 100 mm and a radius of 75 mm as shown in FIG. 1, and crack and collapse of the substrate 1 were confirmed.

Example 7

A white fiber substrate was prepared in the same operation as in Example 6 except for using the film of Production Example 6. The same evaluation as in Example 6 was carried out and the results are shown in Table 4.

Example 8

A white fiber substrate was prepared in the same operation as in Example 6 except for using the film of Production Example 7. The same evaluation as in Example 6 was carried out and the results are shown in Table 4.

Example 9

A white fiber substrate was prepared in the same operation as in Example 6 except for using the film of Production Example 8. The same evaluation as in Example 6 was carried out and the results are shown in Table 4.

Example 10

A white fiber substrate was prepared in the same operation as in Example 6 except for not using the prepreg of Example 6 as the adhesive layer. The same evaluation as in Example 6 was carried out and the results are shown in Table 4.

Example 11

A white fiber substrate was prepared in the same operation as in Example 6 except for not using the prepreg of Example 7 as the adhesive layer. The same evaluation as in Example 6 was carried out and the results are shown in Table 4.

Example 12

A white fiber substrate was prepared in the same operation as in Example 6 except for not using the prepreg of Example 8 as the adhesive layer. The same evaluation as in Example 6 was carried out and the results are shown in Table 4.

Example 13

A white fiber substrate was prepared in the same operation as in Example 6 except for using the film of Production Example 9. The same evaluation as in Example 6 was carried out and the results are shown in Table 4.

Example 14

A white fiber substrate was prepared in the same operation as in Example 6 except for using the film of Production Example 10. The same evaluation as in Example 6 was carried out and the results are shown in Table 4.

Comparative Example 3

Two sheets of the white epoxy prepregs were each put between three sheets of the films obtained in Comparative Production Example 4 as adhesive layers so that these materials were alternately superimposed, and the subsequent operations were carried out in the same manner as in Example 6 to prepare a white substrate.

Comparative Example 4

A white fiber substrate was prepared in the same operation as in Example 6 except for using the film of Comparative Production Example 5.

Comparative Example 5

A white fiber substrate was prepared in the same operation as in Example 6 except for using the film of Comparative Production Example 6.

TABLE 4

| | Light reflectance initial stage (% at 450 nm) | Heat resistant characteristics Light reflectance after 150° C., 1,000 hrs (% at 450 nm) | Dimensional stability at molding (twisting and unfastening) | Flexibility of substrate |
|---|---|---|---|---|
| Example 6 | 85 | 83 | Good | Good |
| Example 7 | 82 | 81 | Good | Good |
| Example 8 | 84 | 82 | Good | Good |
| Example 9 | 83 | 81 | Good | Good |
| Example 10 | 88 | 85 | Good | Good |
| Example 11 | 84 | 82 | Good | Good |
| Example 12 | 85 | 83 | Good | Good |
| Example 13 | 80 | 82 | Good | Good |
| Example 14 | 98 | 82 | Good | Good |
| Comparative Example 3 | 75 | 12 | Not good | Not good |
| Comparative Example 4 | 76 | 6 | Not good | Not good |
| Comparative Example 5 | 51 | 50 | Not good | Not good |

Dimensional stability Good: Neither twisting nor unfastening. Not good: Twisting or unfastening present.
Flexibility of substrate Good: Neither crack nor peeling. Not good: Crack or peeling present.

From the results shown in Table 4, it could be understood that Examples 6 to 14 using the fiber film base materials each having a ratio of the conventional flexural rigidity within the range of 3 to 100-fold had high reflectance and excellent in heat resistance, discoloration resistance, dimensional stability and flexibility. When Comparative Example 3 in which the fiber film was not used, a fiber film base material having a ratio of the conventional flexural rigidity or less than 3-fold (Comparative Example 5), or a fiber film base material having that of exceeding 100-fold (Comparative Example 4) were used, each characteristic was inferior to that of Examples.

From the results as mentioned above, it could be clarified that the white fiber substrates of the present invention had high reflectance, and were excellent in heat resistance, discoloration resistance, dimensional stability and flexibility.

III. Evaluation of Metal Clad Composite Laminated Substrate

Production Example 11

By using methyltrimethoxysilane (Product name: KBM-13 available from Shin-Etsu Chemical Co., Ltd.) as the organosilicon compound, it was coated onto a glass cloth (Used yarn: E250, density: 59 warp yarns/25 mm, 57 weft yarns/25 mm, thickness: 87 µm, mass: 95 g/m$^2$) and the material was dried under heating at 100° C. for 10 minutes. Thereafter, the material was subjected to heat treatments at 100° C. for 1 hour and at 200° C. for 1 hour to prepare a surface-treated glass fiber film (A5).

1. Appearance

Uniformity of the surface of the obtained surface-treated glass fiber film, i.e., whether the surface is smooth and whether a crack is present or not on the surface were confirmed by naked eyes.

2. Conventional Flexural Rigidity

A conventional flexural rigidity of the obtained surface-treated glass fiber film was measured by the method described in JIS R 3420, and a ratio of the conventional flexural rigidity was calculated from the equation mentioned below.

Ratio of conventional flexural rigidity=conventional flexural rigidity of the surface-treated glass fiber film/conventional flexural rigidity of the untreated glass fiber Also, from the obtained surface-treated fiber film, a rectangular test piece having a width of 25 mm and a length of 250 mm was cut from the fiber to be tested with each 6 pieces in the warp direction, and measurement of the linear expansion coefficient was carried out.

3. Linear Expansion Coefficient

A sample having a width of 3 mm, a length of 25 mm and a thickness of 50 to 300 mm was cut from the obtained surface-treated glass fiber film, and the sample was subjected to the tensile test using a thermomechanical analysis (TMA) apparatus (Name of apparatus: TMA/SS6000, manufactured by Seiko Instruments Inc.) in the temperature range of from −60° C. to 200° C. with a temperature raising rate of 5° C./min while applying a load of 100 mN. A thermal expansion coefficient was measured from an elongation amount of the surface-treated glass fiber film relative to the temperature.

These respective measurement results are shown in Table 5.

Production Example 12

To 100 g of water were added 10 g of 3-glycidoxypropyltrimethoxysilane (Product name: KBM-403 available from Shin-Etsu Chemical Co., Ltd.) as an organosilicon compound, 0.02 g of a surfactant and 0.05 g of acetic acid to prepare a coating solution. By using the coating solution, a surface-treated glass fiber film (A6) was obtained in the same manner as in Production Example 11. By using the obtained glass fiber film, appearance, mechanical characteristics and a linear expansion coefficient were evaluated in the same manner as in Production Example 11.

Production Example 13

To 50 g of toluene was added 50 g of an epoxy group-containing oligomer (Product name: X-41-1059A available from Shin-Etsu Chemical Co., Ltd.) to prepare a coating solution. To the coating solution was added 10 g of titanium oxide (Product name: PF-691, average particle diameter: about 0.2 µm available from Ishihara Sangyo Kaisha Ltd.) to prepare a toluene dispersion. By using the dispersion and a glass cloth (Used yarn: D450, density: 53 warp yarns/25 mm, 53 weft yarns/25 mm, thickness: 42 µm, mass: 47 g/m$^2$), a surface-treated glass fiber film (A7) was obtained in the same manner as in Production Example 11. By using the obtained glass fiber film, appearance, mechanical characteristics and a linear expansion coefficient were evaluated in the same manner as in Production Example 11.

Production Example 14

To 100 g of an addition curing type resin in which an unsaturated group-containing organopolysiloxane containing an $R^1SiO_{1.5}$ unit and a hydrosilyl group-containing organopolysiloxane had been formulated so that H/Vi is 1.1 was added octyl alcohol solution of 1% by mass of chloroplatinic acid so that the platinum became 10 ppm, and 100 g of toluene was added to the mixture to prepare a coating solution. By using the coating solution, a thermally cured surface-treated glass fiber film (A8) was obtained in the same manner as in Production Example 11. By using the obtained glass fiber film, appearance, mechanical characteristics and a linear expansion coefficient were evaluated in the same manner as in Production Example 11.

Comparative Production Example 7

To 95 g of toluene was added 5 g of 3-glycidoxypropyltrimethoxysilane (Product name: KBM-403 available from Shin-Etsu Chemical Co., Ltd.) to prepare a coating solution. A surface-treated glass fiber film (B4) was obtained in the same manner as in Production Example 11 by using the coating solution. By using the obtained glass fiber film, appearance, mechanical characteristics and a linear expansion coefficient were evaluated in the same manner as in Production Example 11.

Comparative Production Example 8

3-Glycidoxypropyltrimethoxysilane (Product name: KBM-403 available from Shin-Etsu Chemical Co., Ltd.) was charged into a mold having a size of 200 mm×240 mm×3 mm and treated with Teflon (Registered Trademark), a glass cloth (Used yarn: E250, density: 59 warp yarns/25 mm, 57 weft yarns/25 mm, thickness: 87 µm, mass: 95 g/m$^2$) was immersed therein, and then, the glass cloth was dried under heating at 100° C. for 10 minutes. An attached amount of the organosilicon compound was 92% by mass, but large cracks were generated at the surface-treated glass fiber film and the subsequent measurement could not be done.

Comparative Production Example 9

By using the glass cloth (Used yarn: D450, density: 53 warp yarns/25 mm, 53 weft yarns/25 mm, thickness: 42 µm, mass: 47 g/m$^2$) (B6) which had not been surface-treated, appearance, mechanical characteristics and a linear expansion coefficient were evaluated in the same manner as in Production Example 11.

TABLE 5

|  | Production Example 11 | Production Example 12 | Production Example 13 | Production Example 14 | Comparative Production Example 7 | Comparative Production Example 8 | Comparative Production Example 9 |
|---|---|---|---|---|---|---|---|
| Surface-treated fiber film | A5 | A6 | A7 | A8 | B4 | B5 | B6 |
| Attached amount (% by mass) | 5.6 | 4.5 | 56.5 | 40.2 | 0.2 | 92.0 | 0 |
| Appearance | Good | Good | Good | Good | Good | Crack | Good |
| Ratio of conventional flexural rigidity | 4.4 | 6.3 | 29.5 | 20.4 | 1.3 | Unable to measure (>100) | 1.0 |
| Linear expansion coefficient (ppm/° C.) | 7 | 8 | 13 | 17 | 6 | Unable to measure | Unable to measure |

As shown in Table 5, it could be understood that, in the case of the glass fiber which had not been surface-treated or in the case where the attached amount of the resin is too little, the ratio of the conventional flexural rigidity became low, the film did not have a self-standing property and the fiber was not fixed. On the other hand, when the attached amount was too much, cracks were generated at the surface. In Production Examples 11 to 14, good surface-treated glass fiber films in which the ratios of the conventional flexural rigidity became within the range of 3 to 100-fold could be obtained by adjusting the attached amount. By using the surface-treated glass fiber films prepared in Production Examples 11 to 14, metal clad composite laminated substrates were prepared by the method described below and their evaluations were carried out.

Synthesis Example 1

—Organopolysiloxane Resin (a2)—

In a toluene solvent were dissolved 952.5 g of an organosilane represented by $PhSiCl_3$ (81.5 mole %), 398.0 g of $ClMe_2SiO(Me_2SiO)_8SiMe_2Cl$ (9.1 mole %), 37.8 g of $MeViSiCl_2$ (4.9 mole %) and 30.2 g of $Me_2ViSiCl$ (4.5 mole %), and the solution was added dropwise into water to co-hydrolyze, followed by washing, neutralization by alkali washing and dehydration, and then, the solvent was stripped to synthesize an organopolysiloxane resin (a2). The resin had a weight average molecular weight of 11,000, and a vinyl group content of 0.05 mole/100 g.

Synthesis Example 2

—Organopolysiloxane Resin (a3)—

In a toluene solvent were dissolved 562.1 g of an organosilane represented by $PhS_iCl_3$ (90 mole %) and 47.8 g of $V_iS_iCl_3$ (10 mole %), and the solution was added dropwise into water to co-hydrolyze, followed by washing, neutralization by alkali washing and dehydration, and then, the solvent was stripped to synthesize an organopolysiloxane resin (a3). The resin had a weight average molecular weight of 4,000, and the vinyl group content of 0.08 mole/100 g.

Synthesis Example 3

—Hydrogen Polysiloxane Rresin (b2)—

In a toluene solvent were dissolved 666.8 g of an organosilane represented by $PhSiCl_3$ (81.8 mole %), 278.6 g of $ClMe_2SiO(Me_2SiO)_8SiMe_2Cl$ (9.1 mole %) and 40.3 g of $MeHSiCl_2$ (9.1 mole %), and the solution was added dropwise into water to co-hydrolyze, followed by washing, neutralization by alkali washing and dehydration, and then, the solvent was stripped to synthesize a hydrogen polysiloxane resin (b2). The resin had a weight average molecular weight of 11,000, and the hydrosilyl group content of 0.05 mole/100 g.

Synthesis Example 4

—Hydrogen Polysiloxane Resin (b3)—

In a toluene solvent were dissolved 666.8 g of an organosilane represented by $PhSiCl_3$ (81.8 mole %), 278.6 g of $ClMe_2SiO(Me_2SiO)_8SiMe_2Cl$ (9.1 mole %) and 31.6 g of $Me_2HSiCl$ (9.1 mole %), and the solution was added dropwise into water to co-hydrolyze, followed by washing, neutralization by alkali washing and dehydration, and then, the solvent was stripped to synthesize a hydrogen polysiloxane resin (b3). The resin had a weight average molecular weight of 9,000, and the hydrosilyl group content of 0.05 mole/100 g.

Example 15

95 g of the organopolysiloxane resin (a2) obtained in Synthesis Example 1, 105 g of the hydrogen polysiloxane resin (b2) obtained in Synthesis Example 3, 0.2 g of acetylene alcohol series ethynylmethyldecylcarbinol as a reaction inhibitor, and 0.2 g of an octyl alcohol solution containing 1% by mass of chloroplatinic acid were added and well mixed to obtain a base composition. To the base composition was added 290 g of toluene as a solvent, and were further added 395 g of alumina (Product name: Admafine AO-502, average particle diameter: about 0.7 μm, available from Admatechs Co., Ltd.) and 10 g of titanium dioxide (Product name: PF-691, average particle diameter: about 0.2 μm, available from Ishihara Sangyo Kaisha Ltd.), and the mixture was stirred by a thinky mixer to prepare a toluene dispersion of a silicone resin composition.

The surface-treated glass fiber film (A5) obtained in Production Example 11 was immersed in the toluene dispersion, whereby the toluene dispersion was coated onto the above-mentioned surface-treated glass fiber film. The surface-treated glass fiber film was allowed to stand at 110° C. for 8 minutes to obtain a prepreg in an uncured state (A-stage state) in which toluene had been evaporated. A solid film had been formed on this prepreg at room temperature. Two sheets of the prepregs were molded under pressure by a hot pressing apparatus at 160° C. for 20 minutes, and then, at 200° C. for 70 minutes to obtain a composite laminated substrate (E-1-1). Also, two sheets of the prepregs were put between two sheets of copper foils (Furukawa Electric Co., Ltd., thickness: 35 μm) and molded under pressure by a hot pressing apparatus at 160° C. for 20 minutes, and then, at 200° C. for 70 minutes to obtain a copper clad composite laminated substrate (E-1-2).

4. Appearance

The surface of the obtained composite laminated substrate was observed by naked eyes to confirm the presence or absence of unfastening and twisting of the fiber.

5. Heat Resistance

The obtained composite laminated substrate was subjected to an IR reflow treatment at 260° C. for 60 seconds using an IR reflow apparatus, and then, change in a color at the surface thereof was observed by naked eyes.

6. Warpage After IR Reflow Test

A substrate (a length: 50 mm and a width: 100 mm) having a shape as shown in FIG. 2 was prepared by using the obtained copper clad composite laminated substrate. With regard to the prepared substrate, after subjecting to an IR reflow treatment at 260° C. for 60 seconds by using an IR reflow apparatus (Name of apparatus: TNR15-225LH, manufactured by TAMURA Corporation), warpage (unit: mm) of the substrate in the longitudinal direction was measured.

These respective measurement results are shown in Table 6.

Example 16

A composite laminated substrate (E-2-1) and a copper clad composite laminated substrate (E-2-2) were obtained in the same manner as in Example 15 except for using 71 g of the organopolysiloxane resin (a3) obtained in Synthesis Example 2 and 129 g of the hydrogen polysiloxane resin (b2) obtained in Synthesis Example 3. By using the obtained composite laminated substrate and the copper clad composite laminated substrate, appearance, an IR reflow test and heat resistance were evaluated in the same manner as in Example 15.

Example 17

A composite laminated substrate (E-3-1) and a copper clad composite laminated substrate (E-3-2) were obtained in the same manner as in Example 15 except for using 95 g of the organopolysiloxane resin (a2) obtained in Synthesis Example 1 and 105 g of the hydrogen polysiloxane resin (b3) obtained in Synthesis Example 4. By using the obtained composite laminated substrate and the copper clad composite laminated substrate, appearance, an IR reflow test and heat resistance were evaluated in the same manner as in Example 15.

Example 18

A composite laminated substrate (E-4-1) and a copper clad composite laminated substrate (E-4-2) were obtained in the same manner as in Example 15 except for using the surface-treated glass fiber film (A6) obtained in Production Example 12 in place of the surface-treated glass fiber film (A5) obtained in Production Example 11. By using the obtained composite laminated substrate and the copper clad composite laminated substrate, appearance, an IR reflow test and heat resistance were evaluated in the same manner as in Example 15.

Example 19

A composite laminated substrate (E-5-1) and a copper clad composite laminated substrate (E-5-2) were obtained in the same manner as in Example 15 except for using the surface-treated glass fiber film (A7) obtained in Production Example 13 in place of the surface-treated glass fiber film (A5) obtained in Production Example 11. By using the obtained composite laminated substrate and the copper clad composite laminated substrate, appearance, an IR reflow test and heat resistance were evaluated in the same manner as in Example 15.

Example 20

A composite laminated substrate (E-6-1) and a copper clad composite laminated substrate (E-6-2) were obtained in the same manner as in Example 15 except for using the surface-treated glass fiber film (A8) obtained in Production Example 14 in place of the surface-treated glass fiber film (A5) obtained in Production Example 11. By using the obtained composite laminated substrate and the copper clad composite laminated substrate, appearance, an IR reflow test and heat resistance were evaluated in the same manner as in Example 15.

Comparative Example 6

A composite laminated substrate (F-1-1) and a copper clad composite laminated substrate (F-1-2) were obtained in the same manner as in Example 15 except for using a glass fiber (B6) which has not been surface-treated in place of the surface-treated glass fiber film (A5) obtained in Production Example 11. By using the obtained composite laminated substrate and the copper clad composite laminated substrate, appearance, an IR reflow test and heat resistance were evaluated in the same manner as in Example 15. In the following, the evaluation results are shown in Table 7.

Comparative Example 7

A composite laminated substrate (F-2-1) and a copper clad composite laminated substrate (F-2-2) were obtained in the same manner as in Example 16 except for using a glass fiber (B6) which has not been surface-treated in place of the surface-treated glass fiber film (A5) obtained in Production Example 11. By using the obtained composite laminated substrate and the copper clad composite laminated substrate, appearance, an IR reflow test and heat resistance were evaluated in the same manner as in Example 16.

Comparative Example 8

The glass fiber (B6) which had not been treated by an organosilicon compound was impregnated with a slurry liquid of an epoxy resin composition comprising 10 parts by mass of a cresol novolak epoxy resin (Product name: EPICRON N-695, available from DIC Corporation), 5 parts by mass of a phenol novolak resin (Product name: PHENOLITE TD-2090, available from DTC Corporation), 0.1 part by mass of an imidazole catalyst (Product name: 2E4MZ, available from Shikoku Chemicals Corporation), 85 parts by mass of spherical silica (Product name: SC-2050-SE, available from Admatechs Co., Ltd.) and 50 parts by mass of an MEK solvent, and dried at 100° C. for 10 minutes to obtain an uncured epoxy resin-impregnated glass cloth. Using four sheets of the obtained uncured epoxy resin-impregnated glass clothes, a glass epoxy substrate (F-3-1) and a copper clad glass epoxy substrate (F-3-2) were obtained in the same manner as in Example 15. By using the obtained glass epoxy substrate and the copper clad glass epoxy substrate, appearance, an IR reflow test and heat resistance were evaluated in the same manner as in Example 15.

TABLE 6

|  | Example 15 | Example 16 | Example 17 | Example 18 | Example 19 | Example 20 |
|---|---|---|---|---|---|---|
| Insulating layer | A5 | A5 | A5 | A6 | A7 | A8 |
| Component (A) | a2 | a3 | a2 | a2 | a2 | a2 |
| Component (B) | b2 | b2 | b3 | b2 | b2 | b2 |
| Appearance | Good | Good | Good | Good | Good | Good |
| Heat resistance | No discoloration | No discoloration | No discoloration | No discoloration | No discoloration | No discoloration |
| Warpage after IR reflow test (mm) | 2 | 2 | 2 | 2 | 2 | 3 |

TABLE 7

|  | Comparative Example 6 | Comparative Example 7 | Comparative Example 8 |
|---|---|---|---|
| Insulating layer | B6 | B6 | White glass epoxy substrate |
| Component (A) | a2 | a3 | — |
| Component (B) | b2 | b2 | — |
| Appearance | Unfastening and twisting generated | Unfastening and twisting generated | Unfastening and twisting generated |
| Heat resistance | No discoloration | No discoloration | Discoloration present |
| Warpage after IR reflow test (mm) | 10 | 9 | 2 |

As shown in Table 6, in Examples 15 to 20, by using good glass fiber films, substrates having neither unfastening nor twisting of the glass fiber can be obtained. Therefore, it could be clarified that due to inner shear stress therein, generation of twisting and warpage was suppressed in the substrate itself, and good results could be obtained in the IR reflow test. In addition, the glass fiber film which had been surface-treated by the organosilicon compound was used, and the thermosetting resin composition to be coated on the film was made from the silicone resin composition, so that it could be clarified that the substrate had high discoloration resistance.

On the other hand, as shown in Table 7, in Comparative Examples 6 and 7 using the glass fiber which had not been applied to the surface treatment, unfastening or twisting was generated on the glass fiber, and warpage was generated in the IR reflow test. Also, in Comparative Example 8 using the commercially available white glass epoxy substrate, good results were shown in the IR reflow test by the action of the epoxy resin but discoloration was generated.

From the results mentioned above, it could be clarified that the metal clad composite laminated substrate of the present invention had a uniform and homogeneous insulating layer which did neither generate unfastening nor twisting of the glass fiber, and was a substrate excellent in heat resistance, dimensional stability and discoloration resistance. Thus, it would be suggested that it could be suitably used as a substrate for a semiconductor apparatus in the field requiring high heat resistance to which a high melting point lead-free solder was applied, or in which a high performance device is used.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A substrate which comprises
   a fiber film base material comprising a sheet of a surface-treated fiber film or a plural number of sheets of the surface-treated fiber films being laminated,
   wherein the surface-treated fiber film has a value of a flexural rigidity measured by a method according to JIS R 3420 of 3-fold to 100-fold to a value of a flexural rigidity of a like fiber film before surface treatment,
   wherein the surface-treated fiber film contains a glass fiber, and a part or all of the glass fiber is bundled and surface-treated by a cured product consisting essentially of an organosilicon compound,
   wherein the organosilicon compound consists of one or more compounds selected from the group consisting of an alkoxysilane, a polysilazane and a partially hydrolyzed condensate thereof, and a silicone-modified varnish, where the silicone-modified varnish is at least one selected from the group consisting of an alkyd-modified varnish, a polyester-modified varnish, an epoxy-modified varnish, and an acryl-modified varnish, and
   wherein an amount of the organosilicon compound attached to the fiber film is from 2% by mass to 90% by mass, based on 100% by mass of the surface-treated fiber film.

2. The substrate according to claim 1, wherein the substrate contains a white pigment.

3. The substrate according to claim 1, further comprising a metal layer(s) on one surface or both surfaces of the surface-treated fiber film or a laminate thereof.

4. The substrate according to claim 2, further comprising a metal layer(s) on one surface or both surfaces of the surface-treated fiber film or a laminate thereof.

5. The substrate according to claim 1, wherein the substrate is a substrate comprising a sheet of a prepreg using the surface-treated glass fiber film or a plural number of prepregs being laminated, and
   the prepreg is in an uncured state in which a thermosetting resin composition is coated onto the surface-treated glass fiber film and dried.

6. The substrate according to claim 2, wherein the substrate is a substrate comprising a sheet of a prepreg using the surface-treated glass fiber film or a plural number of prepregs being laminated, and
   the prepreg is in an uncured state in which a thermosetting resin composition is coated onto the surface-treated glass fiber film and dried.

7. The substrate according to claim 3, wherein the substrate is a substrate comprising a sheet of a prepreg using the surface-treated glass fiber film or a plural number of prepregs being laminated, and the prepreg is in an uncured state in which a thermosetting resin composition is coated onto the surface-treated glass fiber film and dried.

8. The substrate according to claim 4, wherein the substrate is a substrate comprising a sheet of a prepreg using the surface-treated glass fiber film or a plural number of prepregs being laminated, and the prepreg is in an uncured state in which a thermosetting resin composition is coated onto the surface-treated glass fiber film and dried.

9. The substrate according to claim 3, wherein the metal layer is formed by either of metal plating, a metal foil or a metal plate.

10. The substrate according to claim 4, wherein the metal layer is formed by either of metal plating, a metal foil or a metal plate.

11. The substrate according to claim 3, further comprising an adhesive resin composition between the surface-treated fiber film and the metal layer(s) or between the surface-treated fiber films with each other, or both of these.

12. The substrate according to claim 4, further comprising an adhesive resin composition between the surface-treated fiber film and the metal layer(s) or between the surface-treated fiber films with each other, or both of these.

13. The substrate according to claim 11, wherein the adhesive resin composition is thermosetting.

14. The substrate according to claim 12, wherein the adhesive resin composition is thermosetting.

15. The substrate according to claim 1, further comprising a material prepared by further superimposing a prepreg base material comprising at least one sheet of a prepreg(s) in an uncured state in which a thermosetting resin composition has been impregnated into the base material and dried being laminated with the fiber film base material, and at least one of the surface-treated fiber film and the prepreg contains a white pigment.

16. The substrate according to claim 15, wherein the substrate comprises the fiber film base material and the prepreg base material which are alternately superimposed.

17. The substrate according to claim 15, wherein the substrate comprises each two or more sheets of the fiber film base materials and the prepreg base materials being laminated.

18. The substrate according to claim 16, wherein the substrate comprises each two or more sheets of the fiber film base materials and the prepreg base materials being laminated.

19. The substrate according to claim 5, wherein the thermosetting resin composition is a silicone resin composition.

20. The substrate according to claim 19, wherein the silicone resin composition comprises the following Components (A) to (C):

(A) an organopolysiloxane represented by the following average composition formula, $$(SiO_2)_a(R^1_{1-m}R^2_m SiO_{1.5})_b(R^1_{2-n}R^2_n SiO)_c(R^1_{3-L}R^2_L SiO_{0.5})_d$$

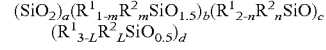

wherein $R^1$ represents a monovalent saturated hydrocarbon group having 1 to 10 carbon atoms or a monovalent aromatic hydrocarbon group having 6 to 12 carbon atoms; $R^2$ represents a monovalent unsaturated hydrocarbon group having 2 to 8 carbon atoms; m=0 to 1, n=0 to 2, L=0 to 3, and $1 \leq m+n+L \leq 6$, and "a", "b", "c" and "d" are each numbers satisfying $0 \leq a \leq 1$, $0 \leq b \leq 1$, $0 \leq c \leq 0.9$, $0 \leq d \leq 0.9$, a+b>0, and a+b+c+d=1, (B) a hydrogen polysiloxane containing one or more hydrosilyl groups, and (C) a platinum based catalyst with an amount effective for curing.

21. The substrate according to claim 5, wherein the thermosetting resin composition contains a filler.

22. The substrate according to claim 1, wherein the surface-treated fiber film contains a filler.

23. The substrate according to claim 21, wherein the filler contains a white pigment.

24. The substrate according to claim 22, wherein the filler contains a white pigment.

25. The substrate according to claim 1, wherein the substrate is a substrate which is bendable at 90° or more.

26. A semiconductor apparatus which is prepared by using the substrate according to claim 1.

27. The substrate according to claim 1, wherein the amount of the organosilicon compound attached to the fiber film is from 4.5% by mass to 70% by mass, based on 100% by mass of the surface-treated fiber film.

28. The substrate according to claim 1, wherein the organosilicon compound consists of one or more compounds selected from the group consisting of an alkoxysilane, and a polysilazane and a partially hydrolyzed condensate thereof.

29. The substrate according to claim 1, wherein the epoxy-modified varnish contains an epoxy group-containing alkoxysilane oligomer.

* * * * *